(12) United States Patent
Cha et al.

(10) Patent No.: US 12,507,517 B2
(45) Date of Patent: Dec. 23, 2025

(54) DISPLAY DEVICE

(71) Applicant: Samsung Display Co., LTD., Yongin-si (KR)

(72) Inventors: Jong Hwan Cha, Yongin-si (KR); Kwang Taek Hong, Yongin-si (KR); Ki Nyeng Kang, Yongin-si (KR); Hong Joon Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 423 days.

(21) Appl. No.: 18/093,588

(22) Filed: Jan. 5, 2023

(65) Prior Publication Data

US 2023/0343913 A1    Oct. 26, 2023

(30) Foreign Application Priority Data

Apr. 25, 2022   (KR) .......................... 10-2022-0050838

(51) Int. Cl.
| | |
|---|---|
| *H10H 20/857* | (2025.01) |
| *G09G 3/32* | (2016.01) |
| *H10H 20/831* | (2025.01) |

(52) U.S. Cl.
CPC ............. *H10H 20/857* (2025.01); *G09G 3/32* (2013.01); *H10H 20/8312* (2025.01); *G09G 2310/0278* (2013.01)

(58) Field of Classification Search
CPC . G09G 3/32; G09C 2300/0426; H10H 20/857
See application file for complete search history.

(56) References Cited

U.S. PATENT DOCUMENTS

| | | |
|---|---|---|
| 8,599,347 B2 | 12/2013 | Arasawa et al. |
| 9,437,667 B2 | 9/2016 | Kwon et al. |
| 10,411,083 B2 | 9/2019 | Song et al. |
| (Continued) | | |

FOREIGN PATENT DOCUMENTS

| | | |
|---|---|---|
| JP | 2022-023858 | 2/2022 |
| KR | 2018-0062516 | 11/2018 |
| (Continued) | | |

OTHER PUBLICATIONS

KR 10-2222144 B1 machine translation (Year: 2025).*

*Primary Examiner* — Vincent Wall
(74) *Attorney, Agent, or Firm* — Womble Bond Dickinson (US) LLP

(57) ABSTRACT

A display device includes a first pixel, a second pixel, and a third pixel, each disposed on a substrate and including a pixel circuit, a first metal line disposed at a first metal layer on the substrate, extending in a first direction on a first side of the pixel circuits of the first to third pixels, and electrically connected to at least one of the pixel circuits of the first to third pixels, a second metal line disposed at a second metal layer on the first metal layer, extending in the first direction on a first side of the first metal line, and electrically connected to at least one of the pixel circuits of the first to third pixels, and a third metal line disposed at the first metal layer, extending in the first direction on a first side of the second metal line, and electrically connected to at least one of the pixel circuits of the first to third pixels. Each of the first to third metal lines supplies a voltage to at least one of the pixel circuits of the first to third pixels.

20 Claims, 20 Drawing Sheets

(56) References Cited

U.S. PATENT DOCUMENTS

| | | | |
|---|---|---|---|
| 10,840,321 B2 | 11/2020 | Song et al. | |
| 11,476,318 B2 | 10/2022 | Song et al. | |
| 2012/0146981 A1* | 6/2012 | Lau | G09G 3/20 |
| | | | 345/82 |
| 2022/0344314 A1 | 10/2022 | Park et al. | |
| 2023/0028691 A1* | 1/2023 | Lee | H10K 59/38 |
| 2023/0186854 A1* | 6/2023 | Yoon | G09G 3/3266 |
| | | | 345/694 |
| 2023/0343913 A1* | 10/2023 | Cha | H10H 20/857 |

FOREIGN PATENT DOCUMENTS

| | | |
|---|---|---|
| KR | 2021-0081598 | 2/2021 |
| KR | 10-2222144 | 3/2021 |
| KR | 10-2352312 | 1/2022 |
| KR | 10-2022-0146725 | 11/2022 |
| WO | 2022225281 | 10/2022 |

\* cited by examiner

GL: VGL, HGL, BGL

DISPLAY DEVICE

CROSS-REFERENCE TO RELATED APPLICATION

This application claims priority to and benefits of Korean Patent Application No. 10-2022-0050838 under 35 U.S.C. 119, filed on Apr. 25, 2022, in the Korean Intellectual Property Office (KIPO), the contents of which in its entirety are herein incorporated by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes light emitting elements that may emit light by themselves. The light emitting element may be an organic light emitting diode that uses an organic material as a fluorescent material and an inorganic light emitting diode that uses an inorganic material as a fluorescent material.

SUMMARY

Aspects of the disclosure provide a display device of which a manufacturing process may be readily performed and space utilization may be increased by dispersing a pattern density of metal lines in a high-resolution display device.

Aspects of the disclosure also provide a display device capable of preventing a contact defect between different metal layers and securing a design margin.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a first pixel, a second pixel, and a third pixel, each disposed on a substrate and including a pixel circuit, a first metal line disposed at a first metal layer on the substrate, extending in a first direction on a first side of the pixel circuits of the first to third pixels, and electrically connected to at least one of the pixel circuits of the first to third pixels, a second metal line disposed at a second metal layer on the first metal layer, extending in the first direction on a first side of the first metal line, and electrically connected to at least one of the pixel circuits of the first to third pixels, and a third metal line disposed at the first metal layer, extending in the first direction on a first side of the second metal line, and electrically connected to at least one of the pixel circuits of the first to third pixels. Each of the first to third metal lines may supply a voltage to at least one of the pixel circuits of the first to third pixels.

The first metal line may supply an initialization voltage to the pixel circuits of the first to third pixels.

The second metal line may supply a first data voltage to the pixel circuit of the first pixel, and the third metal line may supply a second data voltage to the pixel circuit of the second pixel.

The second metal line may be directly connected to the pixel circuit of the first pixel, and the third metal line may be electrically connected to the pixel circuit of the second pixel through a connection electrode disposed at a third metal layer on the second metal layer.

The display device may further include a fourth metal line disposed at the second metal layer, extending in the first direction on a first side of the third metal line, and electrically connected to at least one of the pixel circuits of the first to third pixels. The fourth metal line may supply a data voltage to the pixel circuit of the third pixel.

The display device may further include a fifth metal line disposed at the first metal layer and extending in the first direction on a first side of the fourth metal line.

The display device may further include a first voltage line disposed at the first metal layer, extending in the first direction on a second side of the pixel circuits of the first to third pixels opposite to the first side of the pixel circuits of the first to third pixels, and supplying a driving voltage to the pixel circuits of the first to third pixels.

The display device may further include a second voltage line disposed at a third metal layer on the second metal layer, extending in a second direction intersecting the first direction on a third side of one of the pixel circuits of the first to third pixels adjacent to the first side of the pixel circuits of the first to third pixels, and receiving a low potential voltage from the fifth metal line.

According to an embodiment of the disclosure, a display device may include a first pixel, a second pixel, and a third pixel, each disposed on a substrate and including a pixel circuit, a data line disposed at a first metal layer on the substrate, extending in a first direction on a first side of the pixel circuits of the first to third pixels, and electrically connected to at least one of the pixel circuits of the first to third pixels, a vertical gate line disposed at the first metal layer and extending in the first direction on a second side of the pixel circuits of the first to third pixels opposite to the first side of the pixel circuits of the first to third pixels, a horizontal gate line disposed at a second metal layer on the first metal layer and extending in a second direction intersecting the first direction on a third side of one of the pixel circuits of the first to third pixels adjacent to the second side of the pixel circuits of the first to third pixels, and an auxiliary gate line branching from the horizontal gate line, disposed at the second metal layer, extending in the first direction, and supplying a gate signal to the pixel circuits of the first to third pixels.

The display device may further include a display driver disposed on a side of the substrate and supplying a data voltage to the data line. The display driver may supply the gate signal to the auxiliary gate line via the vertical gate line and the horizontal gate line.

The display device may further include a sensing line disposed at the first metal layer and extending in the first direction between the auxiliary gate line and the data line.

The data line may include a first data line disposed on a first side of the sensing line and supplying a first data voltage to the pixel circuit of the first pixel, a second data line disposed on a first side of the first data line and supplying a second data voltage to the pixel circuit of the second pixel, and a third data line disposed on a first side of the second data line and supplying a third data voltage to the pixel circuit of the third pixel.

The data line may be electrically connected to at least one of the pixel circuits of the first to third pixels through a connection electrode disposed at a third metal layer on the second metal layer.

According to an embodiment of the disclosure, a display device may include a first pixel, a second pixel, and a third pixel, each disposed on a substrate and including a pixel circuit, a sensing line extending in a first direction on a first side of the pixel circuits of the first to third pixels and supplying an initialization voltage to the pixel circuits of the first to third pixels, a data line extending in the first direction on a first side of the sensing line and supplying a data voltage to at least one of the pixel circuits of the first to third pixels, a first voltage line extending in the first direction on a second side of the pixel circuits of the first to third pixels opposite to the first side of the pixel circuits of the first to third pixels and supplying a driving voltage to the pixel circuits of the first to third pixels, a vertical gate line extending in the first direction on a second side of the first voltage line, a horizontal gate line extending in a second direction intersecting the first direction on a third side of one of the pixel circuits of the first to third pixels adjacent to the second side of the pixel circuits of the first to third pixels and receiving a gate signal from the vertical gate line, and an auxiliary gate line extending from the horizontal gate line in the first direction and supplying the gate signal received from the horizontal gate line to the pixel circuits of the first to third pixels.

The data line may include a first data line disposed on the first side of the sensing line and supplying a first data voltage to the pixel circuit of the first pixel, a second data line disposed on a first side of the first data line and supplying a second data voltage to the pixel circuit of the second pixel, and a third data line disposed on a first side of the second data line and supplying a third data voltage to the pixel circuit of the third pixel.

The sensing line may be disposed at a first metal layer on the substrate. The first data line may be disposed at a second metal layer on the first metal layer.

The sensing line may be electrically connected to the pixel circuits of the first to third pixels through a first connection electrode disposed at a third metal layer on the second metal layer. The first data line may be directly connected to the pixel circuit of the first pixel.

The second data line may be disposed at the first metal layer and may be electrically connected to the pixel circuit of the second pixel through a second connection electrode disposed at the third metal layer. The third data line may be disposed at the second metal layer and may be directly connected to the pixel circuit of the third pixel.

The vertical gate line may be disposed at a first metal layer on the substrate. The horizontal gate line and the auxiliary gate line may be disposed at a second metal layer on the first metal layer.

The display device may further include a display driver disposed on a side of the substrate and supplying the data voltage to the data line. The display driver may supply the gate signal to the auxiliary gate line via the vertical gate line and the horizontal gate line.

With a display device according to embodiments, metal lines extending in a vertical direction and adjacent to each other in a plan view are disposed at different metal layers, and thus, a pattern density of the metal lines in a high-resolution display device may be dispersed, such that a manufacturing process of the display device may be readily performed and space utilization may be increased. Some of data lines may be disposed at a gate layer, such that a connection electrode electrically connecting a thin film transistor and the data lines to each other may not be required, and a short-circuit defect between the lines may be prevented.

With a display device according to embodiments, a gate line extending in a horizontal direction and an auxiliary gate line branching from the gate line and extending in a vertical direction may be formed integrally with each other at a same layer, such that a separate contact hole electrically connecting the gate line and the auxiliary gate line to each other may not be required, a design margin may be secured, and a contact defect between different metal layers may be prevented.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
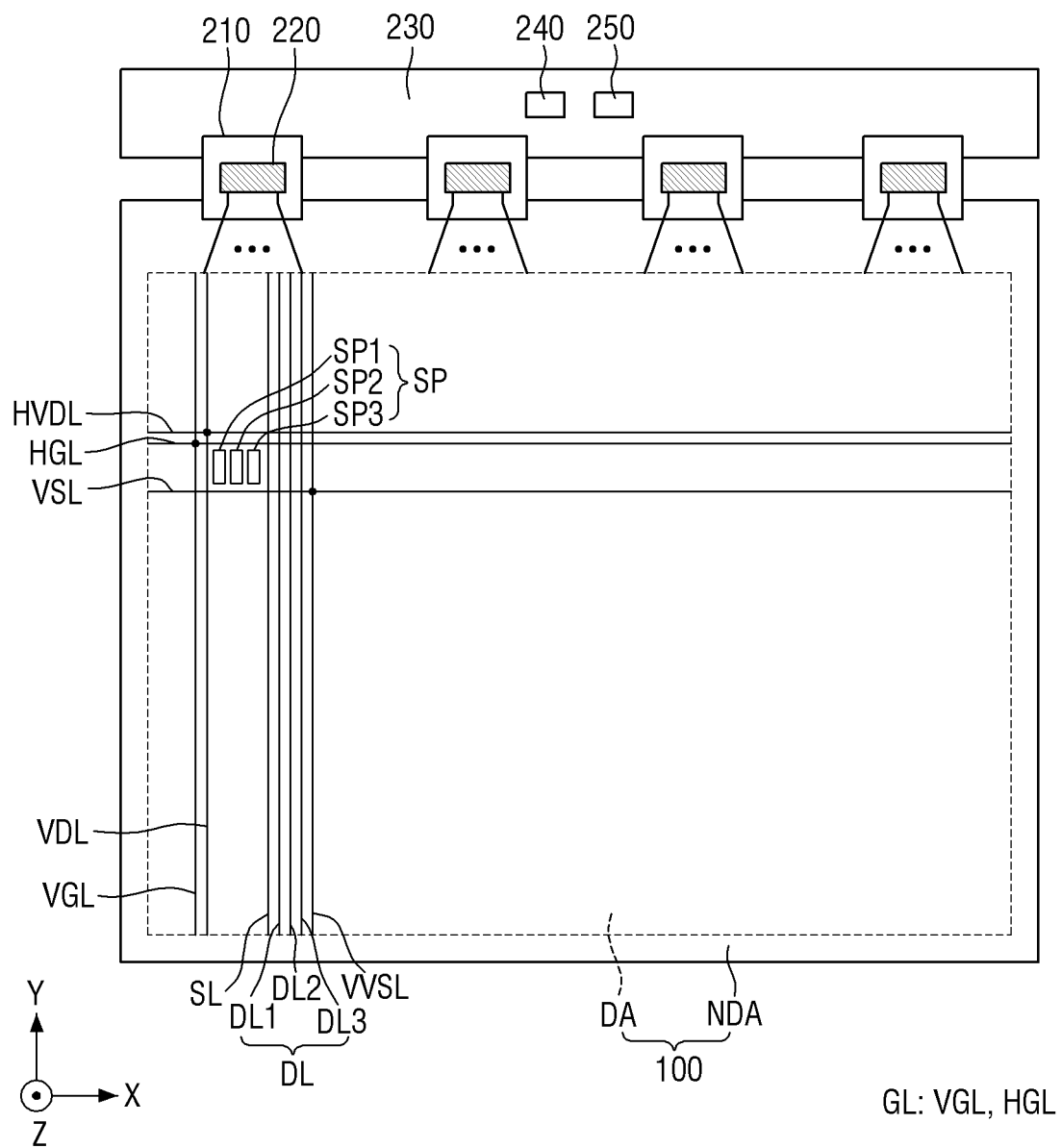
FIG. 1 is a plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terms "above", "top", and "upper surface" as used herein refer to an upward direction (i.e., a Z-axis direction) with respect to the display device. The terms "below", "bottom", and "lower surface" as used herein refer to a downward direction (i.e., a direction opposite to the Z-axis direction) with respect to the display device. In addition, "left", "right", "upper", and "lower" refer to directions when the display device is viewed from above. For example, "left" refers to a direction opposite to an X-axis direction, "right" refers to the X-axis direction, "upper" refers to a Y-axis direction, and "lower" refers to a direction opposite to the Y-axis direction.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a plan view illustrating a display device according to an embodiment.

Referring to FIG. 1, a display device may be a device that displays a moving image or a still image, and may be used as a display screen of various products such as televisions, laptop computers, monitors, billboards, and Internet of Things (JOT) as well as portable electronic devices such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs).

The display device may include a display panel 100, flexible films 210, display drivers 220, a circuit board 230, a timing controller 240, and a power supply part 250.

The display panel 100 may have a rectangular shape in a plan view. For example, the display panel 100 may have a rectangular shape, in a plan view, having long sides in a first direction (X-axis direction) and short sides in a second direction (Y-axis direction). A corner where a long side in the first direction (X-axis direction) and a short side in the second direction (Y-axis direction) meet may be right-angled or may be rounded with a curvature. The shape of the display panel 100 in a plan view is not limited to the rectangular shape, and may be other polygonal shapes, a circular shape, or an elliptical shape. For example, the display panel 100 may be formed to be flat, but is not necessarily limited thereto. In another embodiment, the display panel 100 may be formed to be bent with a curvature.

The display panel 100 may include a display area DA and a non-display area NDA.

The display area DA may be an area displaying an image, and may be defined as a central area of the display panel 100. The display area DA may include multiple pixels SP, gate lines GL, sensing lines SL, data lines DL, horizontal voltage lines HVDL, first voltage lines VDL, vertical voltage lines VVSL, and second voltage lines VSL. The pixels SP may be formed in each of pixel areas intersected by a multiple data lines DL and multiple gate lines GL. The pixel SP may include first to third pixels SP1, SP2, and SP3. Each of the first to third pixels SP1, SP2, and SP3 may be connected to one horizontal gate line HGL and one data line DL. Each of the first to third pixels SP1, SP2, and SP3 may be defined as an area of a minimum unit emitting light.

The first pixel SP1 may emit light of a first color or red light, the second pixel SP2 may emit light of a second color or green light, and the third pixel SP3 may emit light of a third color or blue light. The first to third pixels SP1, SP2, and SP3 may be sequentially arranged in the first direction (X-axis direction), but are not limited thereto.

The gate line GL may include a vertical gate line VGL and a horizontal gate line HGL. Multiple vertical gate lines VGL may be connected to the display drivers 220, may extend in the second direction (Y-axis direction), and may be spaced apart from each other in the first direction (X-axis direction). Each of multiple horizontal gate lines HGL may be connected to any one of the vertical gate lines VGL and may extend in the first direction (X-axis direction). The horizontal gate line HGL may supply gate signals to the first to third pixels SP1, SP2, and SP3.

The sensing lines SL may extend in the second direction (Y-axis direction) and may be spaced apart from each other in the first direction (X-axis direction). The sensing line SL may supply an initialization voltage received from the display driver 220 to a pixel circuit of each of the first to third pixels SP1, SP2, and SP3. The sensing line SL may receive a sensing signal from the pixel circuit of each of the first to third pixels SP1, SP2, and SP3 and supply the sensing signal to the display driver 220.

The data lines DL may extend in the second direction (Y-axis direction) and may be spaced apart from each other in the first direction (X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The horizontal voltage lines HVDL may extend in the first direction (X-axis direction) and may be spaced apart from each other in the second direction (Y-axis direction). The horizontal voltage lines HVDL may be connected to the first voltage lines VDL. The horizontal voltage lines HVDL may receive a driving voltage or a high potential voltage to the first voltage lines VDL.

The first voltage lines VDL may extend in the second direction (Y-axis direction) and may be spaced apart from each other in the first direction (X-axis direction). The first voltage lines VDL may supply a driving voltage or a high potential voltage received from the power supply part 250 to the pixels SP.

The vertical voltage lines VVSL may extend in the second direction (Y-axis direction) and may be spaced apart from each other in the first direction (X-axis direction). The vertical voltage lines VVSL may be connected to the second voltage lines VSL. The vertical voltage lines VVSL may supply a low potential voltage received from the power supply part 250 to the second voltage lines VSL.

The second voltage lines VSL may extend in the first direction (X-axis direction) and may be spaced apart from each other in the second direction (Y-axis direction). The second voltage lines VSL may supply the low potential voltage to the pixels SP.

Connection relationships between the pixels SP, the gate lines GL, the sensing lines SL, the data lines DL, the first voltage lines VDL, and the second voltage lines VSL may be changed in design according to the number and an arrangement of the pixels SP.

The non-display area NDA may be defined as an area other than the display area DA in the display panel 100. For example, the non-display area NDA may include fan-out lines connecting the data lines DL, the sensing lines SL, and/or the vertical gate lines VGL to the display drivers 220 and pad parts (not illustrated) connected to the flexible films 210.

Input terminals provided on sides of the flexible films 210 may be attached to the circuit board 230 by a film attaching process, and output terminals provided on another sides of the flexible films 210 may be attached to the pad parts by a film attaching process. For example, the flexible film 210 may be a flexible film that may be bent, such as a tape carrier package or a chip on film. The flexible films 210 may be bent toward a lower surface of the display panel 100 in order to decrease a bezel area of the display device.

The display driver 220 may be mounted on the flexible film 210. For example, the display driver 220 may be implemented as an integrated circuit (IC). The display drivers 220 may receive digital video data and data control signals from the timing controller 240, convert the digital video data into analog data voltages according to the data control signals, and supply the analog data voltages to the data lines DL through the fan-out lines. The display drivers 220 may generate gate signals according to gate control signals supplied from the timing controller 240 and sequentially supply the gate signals to the vertical gate lines VGL according to a set order.

The circuit board 230 may support the timing controller 240 and the power supply part 250, and transfer signals and power between components of the display drivers 220. For example, the circuit board 230 may supply a signal supplied from the timing controller 240 and a source voltage supplied from the power supply part 250 to the display drivers 220 in order to display an image in each pixel. To this end, signal transmission lines and multiple power lines may be provided on the circuit board 230.

The timing controller 240 may be mounted on the circuit board 230, and may receive image data and timing synchronization signals supplied from a display driving system through a user connector (not illustrated) provided on the circuit board 230. The timing controller 240 may generate the digital video data by aligning the image data to be suitable for a pixel arrangement structure based on the timing synchronization signals, and may supply the generated digital video data to the display drivers 220. The timing controller 240 may generate the data control signals and the gate control signals based on the timing synchronization signals. The timing controller 240 may control a supply timing of data voltages of the display drivers 220 based on the data control signals, and control a supply timing of the gate signals of the display drivers 220 based on the gate control signals.

The power supply part 250 may be disposed on the circuit board 230, and may supply a source voltage to the display drivers 220 and the display panel 100. For example, the power supply part 250 may generate a driving voltage or a high potential voltage and supply the driving voltage or the high potential voltage to the first voltage lines VDL, may generate a low potential voltage and supply the low potential voltage to the vertical voltage lines VVSL.

Figure 2:
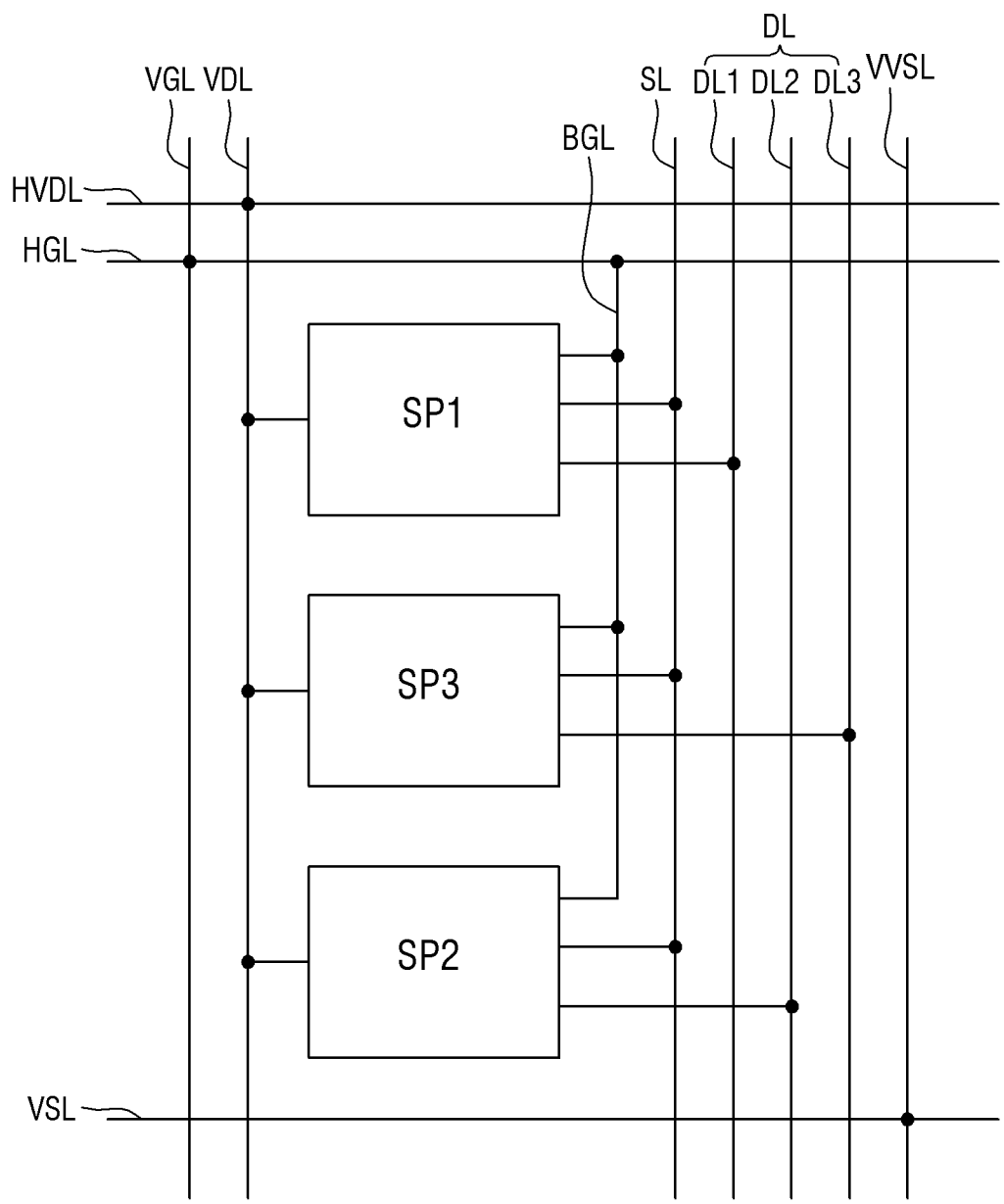
FIG. 2 is a schematic diagram illustrating pixels and lines in the display device according to an embodiment.

FIG. 2 is a schematic diagram illustrating pixels and lines in the display device according to an embodiment.

Referring to FIG. 2, the pixels SP may include first to third pixels SP1, SP2, and SP3. A pixel circuit of the first pixel SP1, a pixel circuit of the third pixel SP3, and a pixel circuit of the second pixel SP2 may be arranged in a direction opposite to the second direction (Y-axis direction), but the order and the arrangement of the pixel circuits is not limited thereto.

The first voltage lines VDL may extend in the second direction (Y-axis direction). The first voltage line VDL may be disposed on a side or the left side of the pixel circuits of the first to third pixels SP1, SP2, and SP3. The first voltage lines VDL may supply a driving voltage or a high potential voltage to the pixel circuits of the pixels SP. The first voltage lines VDL may supply the driving voltage to a transistor of each of the pixel circuits of the first to third pixels SP1, SP2, and SP3.

The gate line GL may include a vertical gate line VGL, a horizontal gate line HGL, and an auxiliary gate line BGL.

The vertical gate line VGL may extend in the second direction (Y-axis direction). The vertical gate line VGL may be disposed on a side or the left side of the first voltage line VDL. The vertical gate line VGL may be connected between the display driver 220 and the horizontal gate line HGL. The vertical gate lines VGL may intersect the horizontal gate lines HGL, respectively. The vertical gate line VGL may be insulated from horizontal gate lines except the corresponding horizontal gate line HGL. The vertical gate lines VGL may supply the gate signals received from the display drivers 220 to the horizontal gate lines HGL.

The horizontal gate lines HGL may extend in the first direction (X-axis direction). The horizontal gate line HGL may be disposed on the upper side of the pixel circuit of the first pixel SP1. The horizontal gate line HGL may be connected between the vertical gate line VGL and the auxiliary gate line BGL. The horizontal gate line HGL may supply the gate signal received from the vertical gate line VGL to the auxiliary gate line BGL.

The auxiliary gate line BGL may extend in the direction opposite to the second direction (Y-axis direction) from the horizontal gate line HGL. The auxiliary gate line BGL may be disposed on another side or the right side of the pixel circuits of the first to third pixels SP1, SP2, and SP3. The auxiliary gate line BGL may supply the gate signal received from the horizontal gate line HGL to the pixel circuits of the first to third pixels SP1, SP2, and SP3.

The sensing line SL may extend in the second direction (Y-axis direction). The sensing line SL may be disposed on another side or the right side of the auxiliary gate line BGL. The sensing line SL may supply the initialization voltage received from the display driver 220 to the pixel circuit of each of the first to third pixels SP1, SP2, and SP3. The sensing line SL may receive the sensing signal from the pixel circuit of each of the first to third pixels SP1, SP2, and SP3 and supply the sensing signal to the display driver 220.

The data lines DL may extend in the second direction (Y-axis direction). The data lines DL may supply the data voltages to the pixels SP. The data lines DL may include first to third data lines DL1, DL2, and DL3.

The first data line DL1 may extend in the second direction (Y-axis direction). The first data line DL1 may be disposed on another side or the right side of the auxiliary gate line BGL. The first data line DL1 may supply the data voltage received from the display driver 220 to the pixel circuit of the first pixel SP1.

The second data line DL2 may extend in the second direction (Y-axis direction). The second data line DL2 may be disposed on another side or the right side of the first data line DL1. The second data line DL2 may supply the data voltage received from the display driver 220 to the pixel circuit of the second pixel SP2.

The third data line DL3 may extend in the second direction (Y-axis direction). The third data line DL3 may be disposed on another side or the right side of the second data line DL2. The third data line DL3 may supply the data voltage received from the display driver 220 to the pixel circuit of the third pixel SP3.

The vertical voltage line VVSL may extend in the second direction (Y-axis direction). The vertical voltage line VVSL may be disposed on another side or the right side of the third data line DL3. The vertical voltage line VVSL may be connected between the power supply part 250 and the second voltage line VSL. The vertical voltage line VVSL may supply a low potential voltage supplied from the power supply part 250 to the second voltage line VSL.

The second voltage lines VSL may extend in the first direction (X-axis direction). The second voltage lines VSL may be disposed on the lower side of the pixel circuit of the second pixel SP2. The second voltage line VSL may supply the low potential voltage received from the vertical voltage line VVSL to the first to third pixels SP1, SP2, and SP3.

Figure 3:
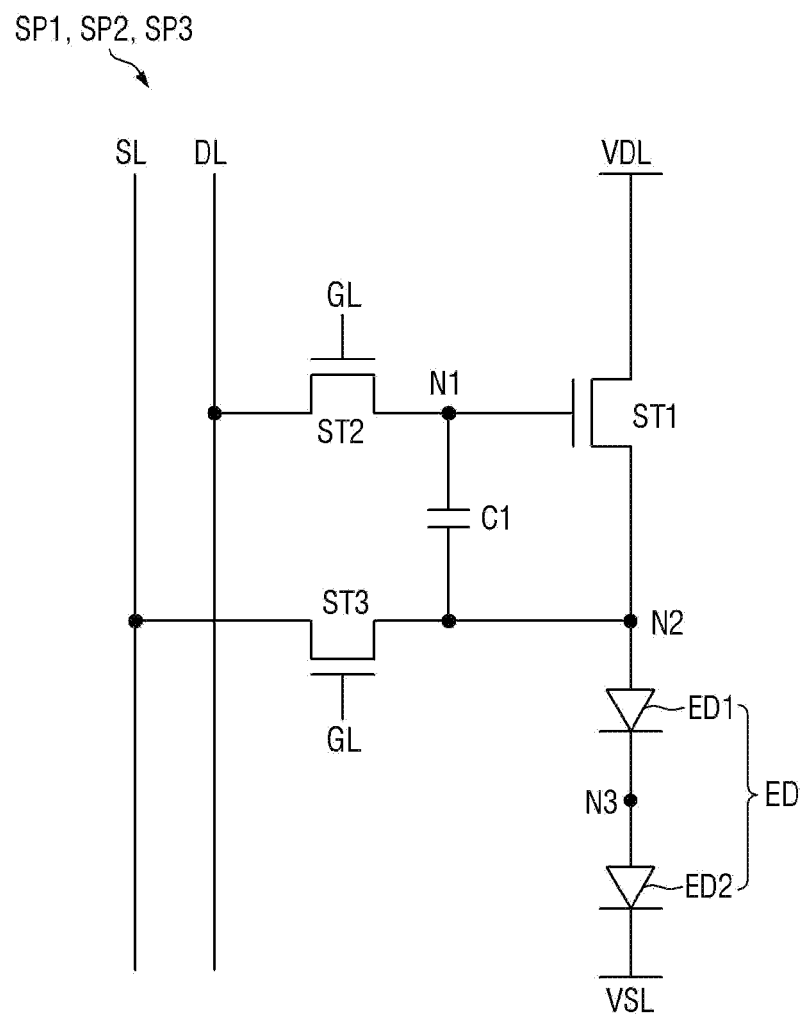
FIG. 3 is a schematic diagram of an equivalent circuit of a pixel of the display device according to an embodiment.

FIG. 3 is a schematic diagram of an equivalent circuit of a pixel of the display device according to an embodiment.

Referring to FIG. 3, each pixel circuit of the pixels SP may be connected to the gate line GL, the first voltage line VDL, the data line DL, the sensing line SL, and the second voltage line VSL.

Each pixel circuit of first to third pixels SP1, SP2, and SP3 may include first to third transistors ST1, ST2, and ST3, a first capacitor C1, and multiple light emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the first voltage line VDL, and the source electrode of the first transistor ST1 may be connected to a second node N2. The first transistor ST1 may control a source-drain current (or a driving current) according to a data voltage applied to the gate electrode.

The light emitting elements ED may include a first light emitting element ED1 and a second light emitting element ED2. The first and second light emitting elements ED1 and ED2 may be connected to each other in series. The first and second light emitting elements ED1 and ED2 may receive the driving current to emit light. A light emission amount or luminance of the light emitting element ED may be proportional to a magnitude of the driving current. The light emitting element ED may be an inorganic light emitting element including a first electrode, a second electrode, and an inorganic semiconductor disposed between the first electrode and the second electrode.

A first electrode of the first light emitting element ED1 may be connected to the second node N2, and a second electrode of the first light emitting element ED1 may be connected to a third node N3. The first electrode of the first light emitting element ED1 may be connected to the source electrode of the first transistor ST1, a source electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and a second electrode of the second light emitting element ED2 may be connected to the second voltage line VSL. The first electrode of the second light emitting element ED2 may be connected to the second electrode of the first light emitting element ED1 through the third node N3.

The second transistor ST2 may be turned on by a gate signal from the gate line GL to connect the data line DL and the first node N1, which is connected to the gate electrode of the first transistor ST1, to each other. The second transistor ST2 may be turned on by the gate signal to supply a data voltage to the first node N1. A gate electrode of the second transistor ST2 may be connected to the gate line GL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a gate signal from the gate line GL to connect the sensing line SL and the second node N2, which is connected to the source electrode of the first transistor ST1, to each other. The third transistor ST3 may be turned on by the gate signal to supply an initialization voltage to the second node N2. A gate electrode of the third transistor ST3 may be connected to the gate line GL, a drain electrode of the third transistor ST3 may be connected to the sensing line SL, and the source electrode of the third transistor ST3 may be connected to the second node N2. The source electrode of the third transistor ST3 may be connected to the source electrode of the first transistor ST1, the second capacitor electrode of the first capacitor C1, and the first electrode of the first light emitting element ED1 through the second node N2.

Figure 4:
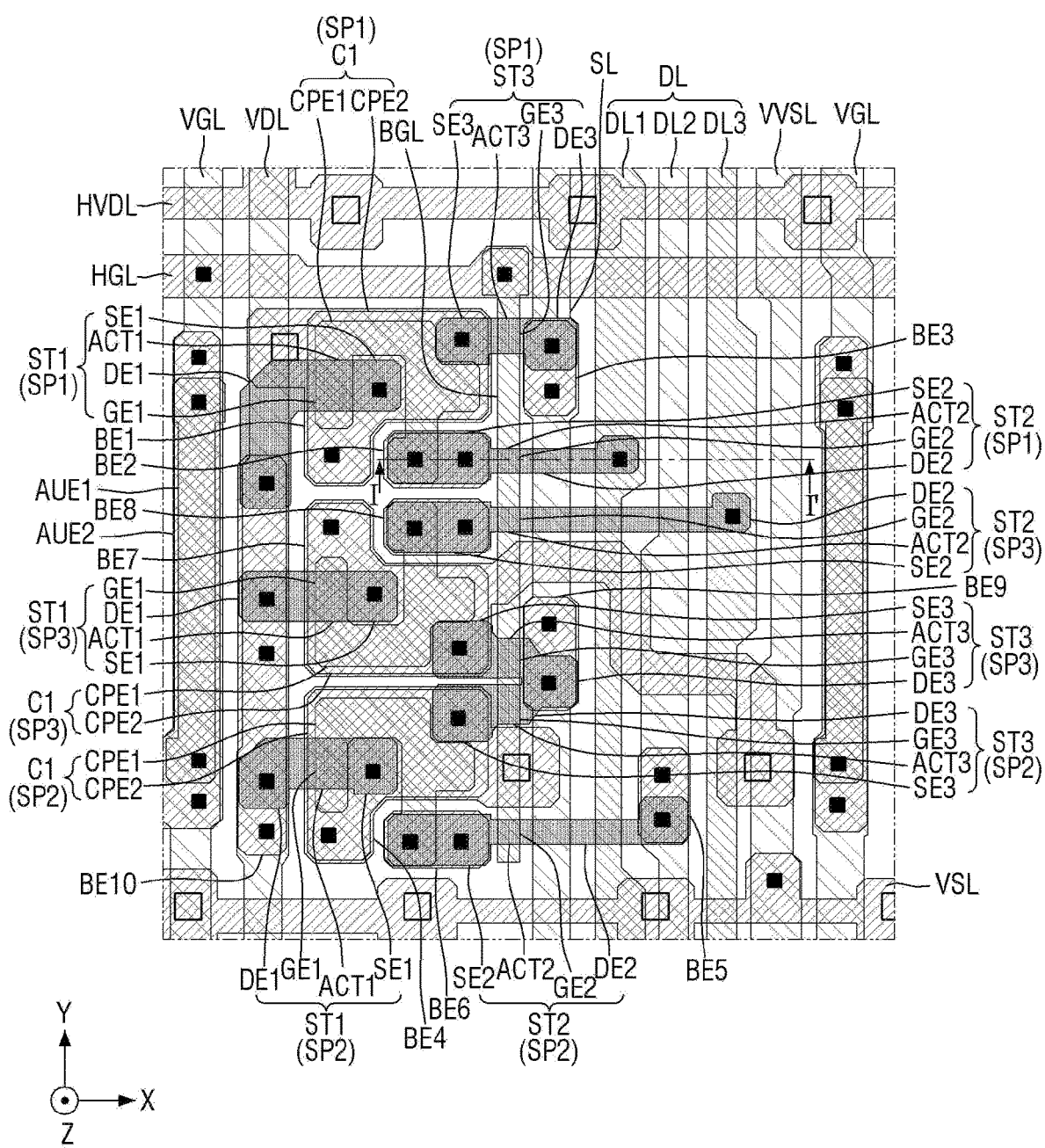
FIG. 4 is a plan view illustrating the pixel of the display device according to an embodiment.
Figure 5:
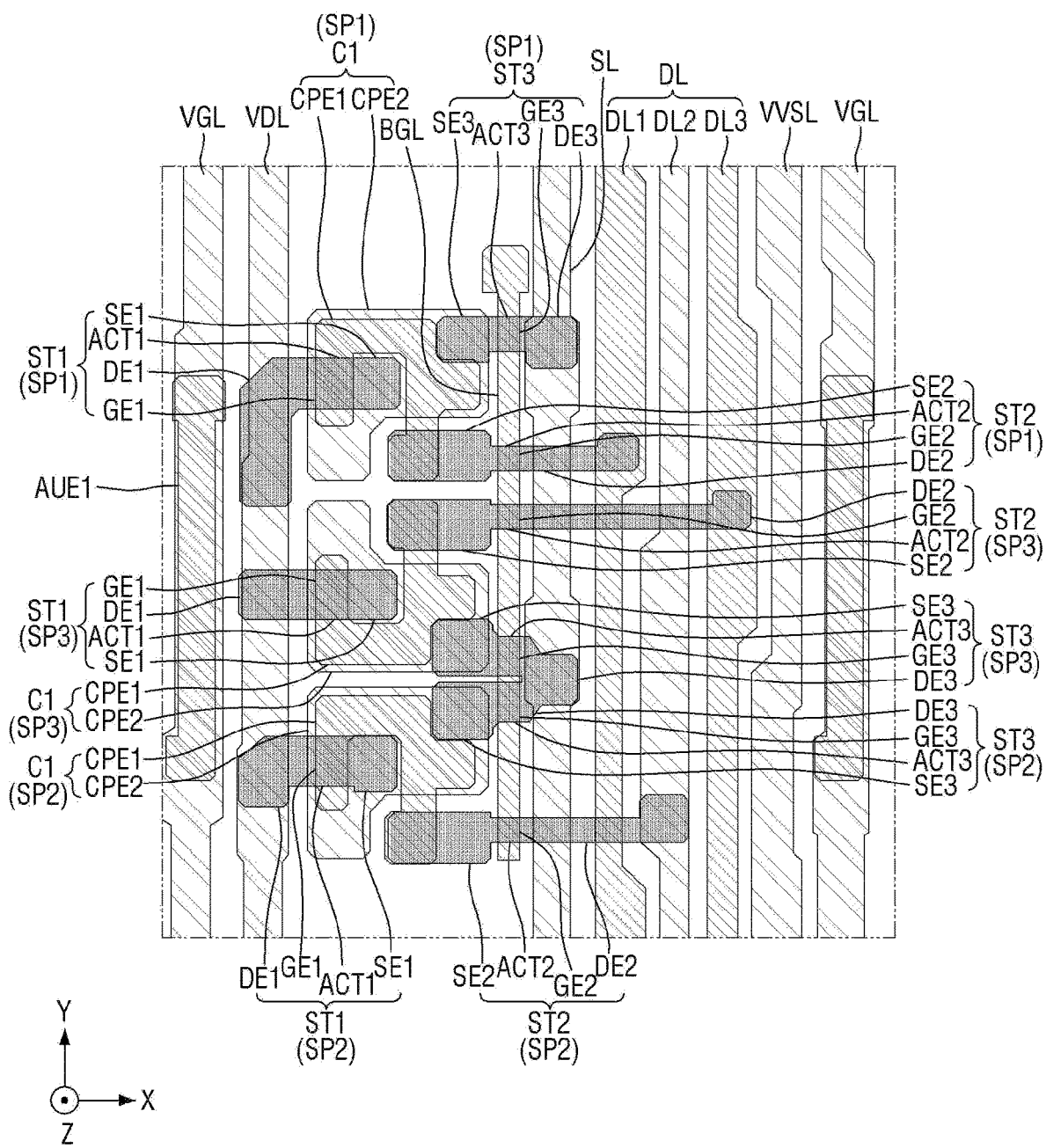
FIG. 5 is a plan view illustrating a metal layer, an active layer, and a gate layer in the display device of FIG. 4.
Figure 6:
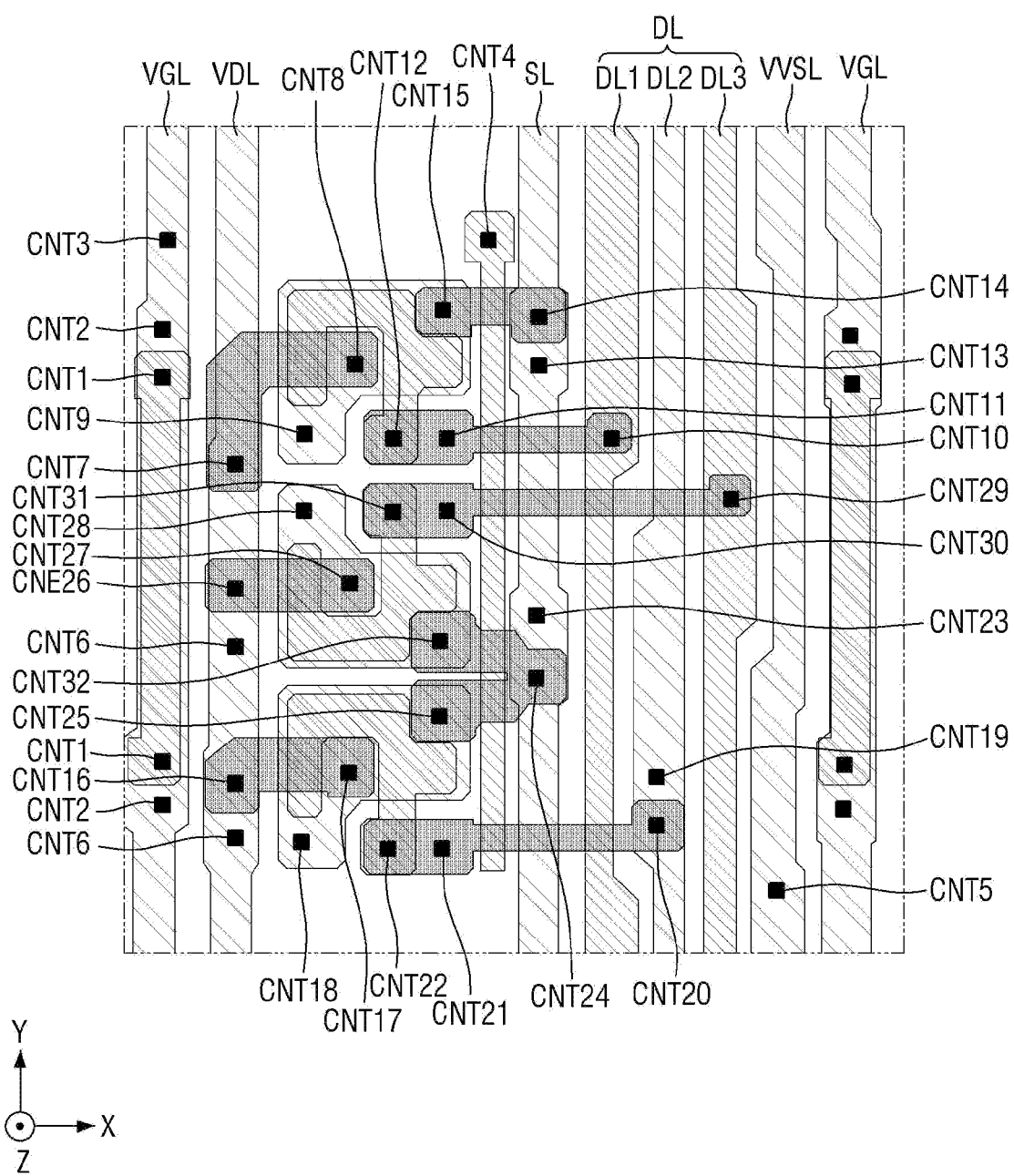
FIG. 6 is a plan view illustrating a metal layer, an active layer, a gate layer, and contact holes in the display device of FIG. 4.
Figure 7:
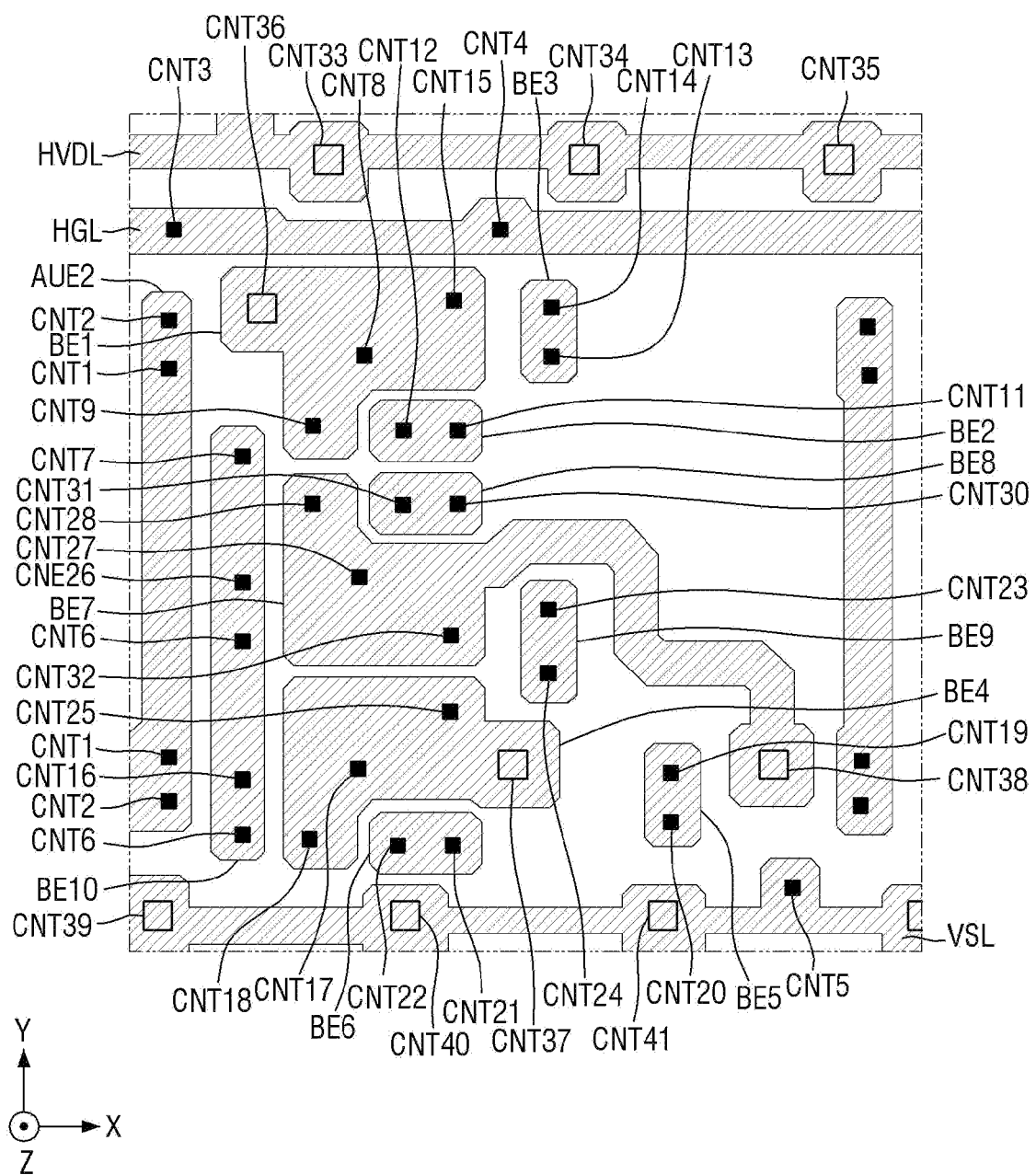
FIG. 7 is a plan view illustrating a source-drain layer and contact holes in the display device of FIG. 4.
Figure 8:
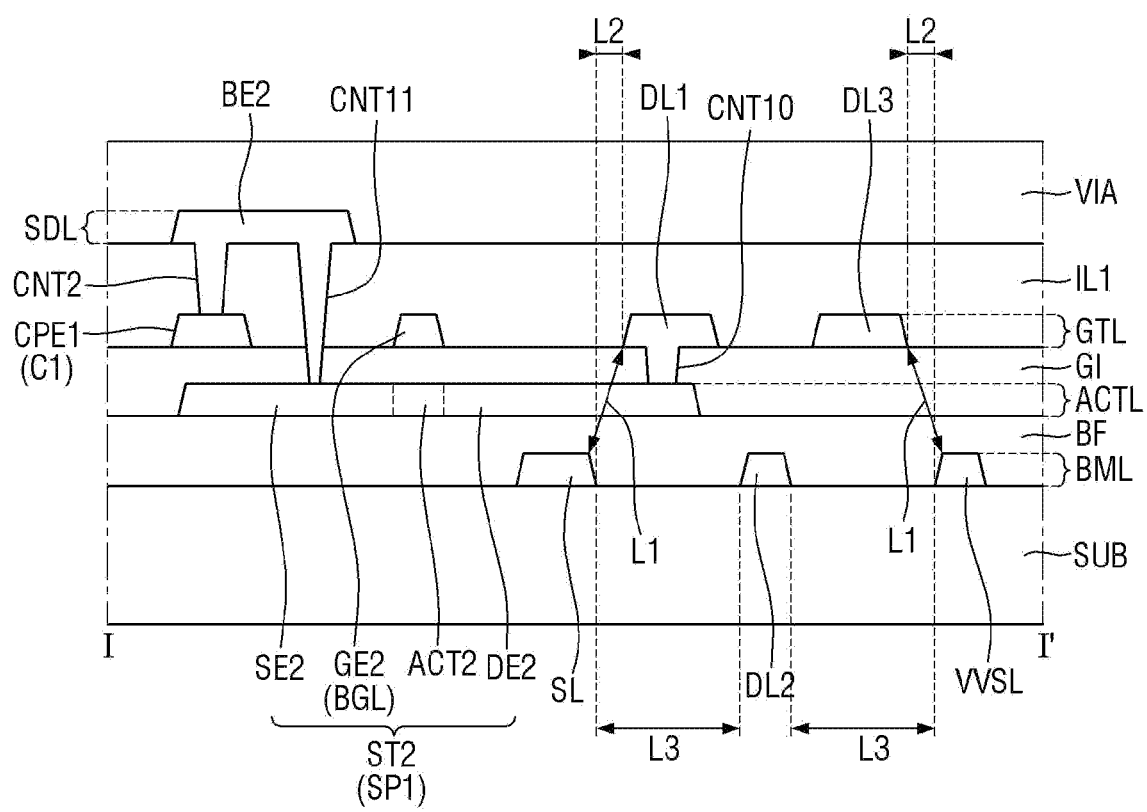
FIG. 8 is a schematic cross-sectional view taken along line I-I' of FIG. 4.

FIG. 4 is a plan view illustrating the pixel of the display device according to an embodiment, and FIG. 5 is a plan view illustrating a metal layer, an active layer, and a gate layer in the display device of FIG. 4. FIG. 6 is a plan view illustrating a metal layer, an active layer, a gate layer, and contact holes in the display device of FIG. 4, and FIG. 7 is a plan view illustrating a source-drain layer and contact holes in the display device of FIG. 4. FIG. 8 is a schematic cross-sectional view taken along line I-I' of FIG. 4. In FIG. 8, a first metal layer BML, a buffer layer BF, an active layer ACTL, a gate insulating film GI, a second metal layer GTL, an interlayer insulating film ILL a third metal layer (or source-drain layer) SDL, and a via layer VIA may be sequentially stacked on a substrate SUB.

Referring to FIGS. 4 to 8, the display panel 100 may include pixel circuits of first to third pixels SP1, SP2, and SP3. A pixel circuit of the first pixel SP1, a pixel circuit of the third pixel SP3, and a pixel circuit of the second pixel SP2 may be arranged in the direction opposite to the second direction (Y-axis direction). The pixel circuit of each of the first to third pixels SP1, SP2, and SP3 may be disposed in a pixel area.

The first voltage line VDL may be disposed at the first metal layer BML on the substrate SUB. The first voltage line VDL may be disposed on a side or the left side of the pixel circuits of the first to third pixels SP1, SP2, and SP3. The first voltage line VDL may overlap a tenth connection electrode BE10 of the third metal layer SDL in a thickness direction (Z-axis direction). The first voltage line VDL may be connected to the tenth connection electrode BE10 through a sixth contact hole CNT6. The tenth connection electrode BE10 may be connected to a drain electrode DE1 of a first transistor ST1 of the first pixel SP1 through a seventh contact hole CNT7, be connected to a drain electrode DE1 of a first transistor ST1 of the second pixel SP2 through a sixteenth contact hole CNT16, and be connected to a drain electrode DE1 of a first transistor ST1 of the third pixel SP3 through a twenty-sixth contact hole CNT26. Accordingly, the first voltage line VDL may supply the driving voltage to the first transistors ST1 of the first to third pixels SP1, SP2, and SP3 through the tenth connection electrode BE10.

The vertical gate line VGL may be disposed at the first metal layer BML. The vertical gate line VGL may be disposed on a side or the left side of the first voltage line VDL. The vertical gate line VGL may overlap a first auxiliary electrode AUE1 of the second metal layer GTL in the thickness direction (Z-axis direction), and may be connected to the first auxiliary electrode AUE1 through multiple first contact holes CNT1. The vertical gate line VGL may overlap a second auxiliary electrode AUE2 of the third metal layer SDL in the thickness direction (Z-axis direction), and may be connected to the second auxiliary electrode AUE2 through multiple second contact hole CNT2. Accordingly, the vertical gate line VGL may be connected to the first and second auxiliary electrodes AUE1 and AUE2 to decrease line resistance.

The horizontal gate line HGL may be disposed at the third metal layer SDL. The horizontal gate line HGL may be disposed on the upper side of the pixel circuit of the first pixel SP1. The horizontal gate line HGL may be connected between the vertical gate line VGL and the auxiliary gate line BGL. The horizontal gate line HGL may be connected to the vertical gate line VGL through a third contact hole CNT3, and may be connected to the auxiliary gate line BGL through a fourth contact hole CNT4. The horizontal gate line HGL may supply the gate signal received from the vertical gate line VGL to the auxiliary gate line BGL.

The auxiliary gate line BGL may be disposed at the second metal layer GTL. The auxiliary gate line BGL may be disposed on another side or the right side of the pixel circuits of the first to third pixels SP1, SP2, and SP3. The auxiliary gate line BGL may supply the gate signal received from the horizontal gate line HGL to the pixel circuits of the first to third pixels SP1, SP2, and SP3.

The horizontal voltage line HVDL may be disposed at the third metal layer SDL. The horizontal voltage line HVDL may be disposed on the upper side of the horizontal gate line HGL. The horizontal voltage line HVDL may receive the driving voltage from the first voltage line VDL. The horizontal voltage line HVDL may supply the driving voltage to an alignment electrode (RMEa in FIG. 19) of each of the first to third pixels SP1, SP2, and SP3. For example, the horizontal voltage line HVDL may be connected to the alignment electrode of the first pixel SP1 through a thirty-third contact hole CNT33. The horizontal voltage line HVDL may be connected to the alignment electrode of the second pixel SP2 through a thirty-fourth contact hole CNT34. The horizontal voltage line HVDL may be connected to the alignment electrode of the third pixel SP3 through a thirty-fifth contact hole CNT35. Here, the alignment electrode of each of the first to third pixels SP1, SP2, and SP3 may be disposed on the via layer VIA, and the thirty-third to thirty-fifth contact holes CNT33, CNT34, and CNT35 may be formed to penetrate through the via layer VIA.

The vertical voltage line VVSL may be disposed at the first metal layer BML. The vertical voltage line VVSL may be disposed on another side or the right side of the third data line DL3. The vertical voltage line VVSL may be connected to the second voltage line VSL of the third metal layer SDL through a fifth contact hole CNT5. Accordingly, the vertical voltage line VVSL may supply the low potential voltage to the second voltage line VSL.

The second voltage line VSL may be disposed at the third metal layer SDL. The second voltage line VSL may be disposed on the lower side of the pixel circuit of the second pixel SP2. The second voltage line VSL may supply the low potential voltage received from the vertical voltage line VVSL to the first to third pixels SP1, SP2, and SP3. For example, the second voltage line VSL may be connected to a second electrode (RME2 in FIG. 19) of the first pixel SP1 through a thirty-ninth contact hole CNT39. The second voltage line VSL may be connected to a second electrode of the second pixel SP2 through a fortieth contact hole CNT40. The second voltage line VSL may be connected to a second electrode of the third pixel SP3 through a forty-first contact hole CNT41. Here, the second electrode of each of the first to third pixels SP1, SP2, and SP3 may be disposed on the via layer VIA, and the thirty-ninth to forty-first contact holes CNT39, CNT40, and CNT41 may be formed to penetrate through the via layer VIA.

The sensing line SL may be disposed at the first metal layer BML. The sensing line SL may be disposed on another side or the right side of the auxiliary gate line BGL. The sensing line SL may be connected to a third connection electrode BE3 through a thirteenth contact hole CNT13. The third connection electrode BE3 may be connected to a drain electrode DE3 of a third transistor ST3 of the first pixel SP1 through a fourteenth contact hole CNT14. The sensing line SL may be connected to a ninth connection electrode BE9 through a twenty-third contact hole CNT23. The ninth connection electrode BE9 may be connected to a drain electrode DE3 of a third transistor ST3 of the second pixel SP2 and a drain electrode DE3 of a third transistor ST3 of the third pixel SP3 through a twenty-fourth contact hole CNT24. Accordingly, the sensing line SL may supply the initialization voltage to the third transistor ST3 of each of the first to third pixels SP1, SP2, and SP3 and receive a sensed signal from the third transistor ST3 of the first to third pixels SP1, SP2, and SP3.

The first data line DL1 may be disposed at the second metal layer GTL. The first data line DL1 may be disposed on another side or the right side of the sensing line SL. The first data line DL1 may be directly connected (or electrically connected) to a drain electrode DE2 of a second transistor ST2 of the first pixel SP1 through a tenth contact hole CNT10. The first data line DL1 may be disposed at the second metal layer GTL, and may thus be connected to the drain electrode DE2 of the second transistor ST2 disposed at the active layer ACTL without a separate connection electrode. Accordingly, the first data line DL1 may supply the data voltage to the second transistor ST2 of the first pixel SP1.

The second data line DL2 may be disposed at the first metal layer BML. The second data line DL2 may be disposed on another side or the right side of the first data line DL1. The second data line DL2 may be connected to a fifth connection electrode BE5 of the third metal layer SDL through a nineteenth contact hole CNT19, and the fifth connection electrode BE5 may be connected to a drain electrode DE2 of a second transistor ST2 of the second pixel SP2 through a twentieth contact hole CNT20. Accordingly, the second data line DL2 may supply the data voltage to the second transistor ST2 of the second pixel SP2.

The third data line DL3 may be disposed at the second metal layer GTL. The third data line DL3 may be disposed on another side or the right side of the second data line DL2. The third data line DL3 may be directly connected (or electrically connected) to a drain electrode DE2 of a second transistor ST2 of the third pixel SP3 through a twenty-ninth contact hole CNT29. The third data line DL3 may be disposed at the second metal layer GTL, and may thus be connected to the drain electrode DE2 of the second transistor ST2 disposed at the active layer ACTL without a separate connection electrode. Accordingly, the third data line DL3 may supply the data voltage to the second transistor ST2 of the third pixel SP3.

The pixel circuit of the first pixel SP1 may include the first to third transistors ST1, ST2, and ST3. The first transistor ST1 of the first pixel SP1 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer GTL. The gate electrode GE1 of the first transistor ST1 may be a portion of a first capacitor electrode CPE1 of the first capacitor C1. The first capacitor electrode CPE1 may be connected to a second connection electrode BE2 of the third metal layer SDL through a twelfth contact hole CNT12, and the second connection electrode BE2 may be connected to a source electrode SE2 of the second transistor ST2 through an eleventh contact hole CNT11.

The drain electrode DE1 and the source electrode SE1 of the first transistor ST1 may be provided by heat-treating the active layer ACTL to make the active layer ACTL conductors. The drain electrode DE1 of the first transistor ST1 may be connected to the tenth connection electrode BE10 of the third metal layer SDL through the seventh contact hole CNT7, and the tenth connection electrode BE10 may be connected to the first voltage line VDL of the first metal layer BML through the sixth contact hole CNT6. The drain electrode DE1 of the first transistor ST1 may receive the driving voltage from the first voltage line VDL.

The source electrode SE1 of the first transistor ST1 may be connected to a first connection electrode BE1 of the third metal layer SDL through an eighth contact hole CNT8. The first connection electrode BE1 may be connected to a second capacitor electrode CPE2 of the first metal layer BML through a ninth contact hole CNT9. Accordingly, the first capacitor C1 may be doubly formed between the first capacitor electrode CPE1 and the second capacitor electrode CPE2 and between the first capacitor electrode CPE1 and the first connection electrode BE1.

The first connection electrode BE1 may be connected to a source electrode SE3 of the third transistor ST3 through a fifteenth contact hole CNT15. The first connection electrode BE1 may be connected to a first electrode (RME1 in FIG. 19) of the first pixel SP1 through a thirty-sixth contact hole CNT36. Here, the first electrode RME1 of the first pixel SP1 may be disposed on the via layer VIA, and the thirty-sixth contact hole CNT36 may be formed to penetrate through the via layer VIA.

The second transistor ST2 of the first pixel SP1 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer GTL. The gate electrode GE2 of the second transistor ST2 may be a portion of the auxiliary gate line BGL.

The drain electrode DE2 of the second transistor ST2 may be directly connected (or electrically connected) to the first data line DL1 disposed at the second metal layer GTL through the tenth contact hole CNT10. The drain electrode DE2 of the second transistor ST2 may receive the data voltage of the first pixel SP1 from the first data line DL1.

The source electrode SE2 of the second transistor ST2 may be connected to the second connection electrode BE2 of the third metal layer SDL through the eleventh contact hole CNT11. The second connection electrode BE2 may be connected to the first capacitor electrode CPE1 through the twelfth contact hole CNT12 to be connected to the gate electrode GE1 of the first transistor ST1.

The third transistor ST3 of the first pixel SP1 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer GTL. The gate electrode GE3 of the third transistor ST3 may be a portion of the auxiliary gate line BGL.

The drain electrode DE3 of the third transistor ST3 may be connected to the third connection electrode BE3 of the third metal layer SDL through the fourteenth contact hole CNT14. The third connection electrode BE3 may be connected to the sensing line SL of the first metal layer BML through the thirteenth contact hole CNT13. The drain electrode DE3 of the third transistor ST3 may receive the initialization voltage from the sensing line SL. The drain electrode DE3 of the third transistor ST3 may supply the sensed signal to the sensing line SL.

The source electrode SE3 of the third transistor ST3 may be connected to a first connection electrode BE1 of the third metal layer SDL through the fifteenth contact hole CNT15. The first connection electrode BE1 may be connected to the source electrode SE1 of the first transistor ST1 through the eighth contact hole CNT8, be connected to the second capacitor electrode CPE2 of the first metal layer BML through the ninth contact hole CNT9, and be connected to the first electrode RME1 of the first pixel SP1 through the thirty-sixth contact hole CNT36.

The pixel circuit of the second pixel SP2 may include the first to third transistors ST1, ST2, and ST3. The first transistor ST1 of the second pixel SP2 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer GTL. The gate electrode GE1 of the first transistor ST1 may be a portion of a first capacitor electrode CPE1 of the first capacitor C1. The first capacitor electrode CPE1 may be connected to a sixth connection electrode BE6 of the third metal layer SDL through a twenty-second contact hole CNT22, and the sixth connection electrode BE6 may be connected to a source electrode SE2 of the second transistor ST2 through a twenty-first contact hole CNT21.

The drain electrode DE1 and the source electrode SE1 of the first transistor ST1 may be provided by heat-treating the active layer ACTL to make the active layer ACTL conductors. The drain electrode DE1 of the first transistor ST1 may be connected to the tenth connection electrode BE10 through the sixteenth contact hole CNT16. The tenth connection electrode BE10 may be connected to the first voltage line VDL of the first metal layer BML through the sixth contact hole CNT6. The drain electrode DE1 of the first transistor ST1 may receive the driving voltage from the first voltage line VDL.

The source electrode SE1 of the first transistor ST1 may be connected to a fourth connection electrode BE4 of the third metal layer SDL through a seventeenth contact hole CNT17. The fourth connection electrode BE4 may be connected to a second capacitor electrode CPE2 of the first metal layer BML through an eighteenth contact hole CNT18. Accordingly, the first capacitor C1 may be doubly formed between the first capacitor electrode CPE1 and the second capacitor electrode CPE2 and between the first capacitor electrode CPE1 and the fourth connection electrode BE4.

The fourth connection electrode BE4 may be connected to a source electrode SE3 of the third transistor ST3 through a twenty-fifth contact hole CNT25. The fourth connection electrode BE4 may be connected to a first electrode (RME1 of FIG. 19) of the second pixel SP2 through a thirty-seventh contact hole CNT37. Here, the first electrode RME1 of the second pixel SP2 may be disposed on the via layer VIA, and the thirty-seventh contact hole CNT37 may be formed to penetrate through the via layer VIA.

The second transistor ST2 of the second pixel SP2 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer GTL. The gate electrode GE2 of the second transistor ST2 may be a portion of the auxiliary gate line BGL.

The drain electrode DE2 of the second transistor ST2 may be connected to the fifth connection electrode BE5 through the twentieth contact hole CNT20, and the fifth connection electrode BE5 may be connected (e.g., directly connected) to the second data line DL2 through the nineteenth contact hole CNT19. The drain electrode DE2 of the second transistor ST2 may receive the data voltage of the second pixel SP2 from the second data line DL2.

The source electrode SE2 of the second transistor ST2 may be connected to the sixth connection electrode BE6 of the third metal layer SDL through the twenty-first contact hole CNT21. The sixth connection electrode BE6 may be connected to the first capacitor electrode CPE1 through the twenty-second contact hole CNT22 to be connected to the gate electrode GE1 of the first transistor ST1.

The third transistor ST3 of the second pixel SP2 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer GTL. The gate electrode GE3 of the third transistor ST3 may be a portion of the auxiliary gate line BGL.

The drain electrode DE3 of the third transistor ST3 may be connected to the ninth connection electrode BE9 of the third metal layer SDL through the twenty-fourth contact hole CNT24. The ninth connection electrode BE9 may be connected to the sensing line SL of the first metal layer BML through the twenty-third contact hole CNT23. The drain electrode DE3 of the third transistor ST3 may receive the initialization voltage from the sensing line SL. The drain electrode DE3 of the third transistor ST3 may supply the sensed signal to the sensing line SL.

The source electrode SE3 of the third transistor ST3 may be connected to the fourth connection electrode BE4 of the third metal layer SDL through the twenty-fifth contact hole CNT25. The fourth connection electrode BE4 may be connected to the source electrode SE1 of the first transistor ST1 through the seventeenth contact hole CNT17, be connected to the second capacitor electrode CPE2 of the first metal layer BML through the eighteenth contact hole CNT18, and be connected to the first electrode (RME1 in FIG. 19) of the second pixel SP2 through the thirty-seventh contact hole CNT37.

The pixel circuit of the third pixel SP3 may include the first to third transistors ST1, ST2, and ST3. The first transistor ST1 of the third pixel SP3 may include an active region ACT1, a gate electrode GE1, the drain electrode DE1, and a source electrode SE1. The active region ACT1 of the first transistor ST1 may be disposed at the active layer ACTL, and may overlap the gate electrode GE1 of the first transistor ST1 in the thickness direction (Z-axis direction).

The gate electrode GE1 of the first transistor ST1 may be disposed at the second metal layer GTL. The gate electrode GE1 of the first transistor ST1 may be a portion of a first capacitor electrode CPE1 of the first capacitor C1. The first capacitor electrode CPE1 may be connected to an eighth connection electrode BE8 of the third metal layer SDL through a thirty-first contact hole CNT31, and the eighth connection electrode BE8 may be connected to a source electrode SE2 of the second transistor ST2 through a thirtieth contact hole CNT30.

The drain electrode DE1 and the source electrode SE1 of the first transistor ST1 may be provided by heat-treating the active layer ACTL to make the active layer ACTL conductors. The drain electrode DE1 of the first transistor ST1 may be connected to the tenth connection electrode BE10 through the twenty-sixth contact hole CNT26. The tenth connection electrode BE10 may be connected to the first voltage line VDL of the first metal layer BML through the sixth contact hole CNT6. The drain electrode DE1 of the first transistor ST1 may receive the driving voltage from the first voltage line VDL.

The source electrode SE1 of the first transistor ST1 may be connected to a seventh connection electrode BE7 of the third metal layer SDL through a twenty-seventh contact hole CNT27. The seventh connection electrode BE7 may be connected to a second capacitor electrode CPE2 of the first metal layer BML through a twenty-eighth contact hole CNT28. Accordingly, the first capacitor C1 may be doubly formed between the first capacitor electrode CPE1 and the second capacitor electrode CPE2 and between the first capacitor electrode CPE1 and the seventh connection electrode BE7.

The seventh connection electrode BE7 may be connected to a source electrode SE3 of the third transistor ST3 through a thirty-second contact hole CNT32. The seventh connection electrode BE7 may be connected to a first electrode (RME1 in FIG. 19) of the third pixel SP3 through a thirty-eighth contact hole CNT38. Here, the first electrode RME1 of the third pixel SP3 may be disposed on the via layer VIA, and the thirty-eighth contact hole CNT38 may be formed to penetrate through the via layer VIA.

The second transistor ST2 of the third pixel SP3 may include an active region ACT2, a gate electrode GE2, the drain electrode DE2, and the source electrode SE2. The active region ACT2 of the second transistor ST2 may be disposed at the active layer ACTL, and may overlap the gate electrode GE2 of the second transistor ST2 in the thickness direction (Z-axis direction).

The gate electrode GE2 of the second transistor ST2 may be disposed at the second metal layer GTL. The gate electrode GE2 of the second transistor ST2 may be a portion of the auxiliary gate line BGL.

The drain electrode DE2 of the second transistor ST2 may be connected to the third data line DL3 disposed at the second metal layer GTL through the twenty-ninth contact hole CNT29. The drain electrode DE2 of the second transistor ST2 may receive the data voltage of the third pixel SP3 from the third data line DL3.

The source electrode SE2 of the second transistor ST2 may be connected to the eighth connection electrode BE8 of the third metal layer SDL through the thirtieth contact hole CNT30. The eighth connection electrode BE8 may be connected to the first capacitor electrode CPE1 through the thirty-first contact hole CNT31 to be connected to the gate electrode GE1 of the first transistor ST1.

The third transistor ST3 of the third pixel SP3 may include an active region ACT3, a gate electrode GE3, the drain electrode DE3, and the source electrode SE3. The active region ACT3 of the third transistor ST3 may be disposed at the active layer ACTL, and may overlap the gate electrode GE3 of the third transistor ST3 in the thickness direction (Z-axis direction).

The gate electrode GE3 of the third transistor ST3 may be disposed at the second metal layer GTL. The gate electrode GE3 of the third transistor ST3 may be a portion of the auxiliary gate line BGL.

The drain electrode DE3 of the third transistor ST3 may be connected to the ninth connection electrode BE9 of the third metal layer SDL through the twenty-fourth contact hole CNT24. The ninth connection electrode BE9 may be connected to the sensing line SL of the first metal layer BML through the twenty-third contact hole CNT23. The drain electrode DE3 of the third transistor ST3 may receive the initialization voltage from the sensing line SL. The drain electrode DE3 of the third transistor ST3 may supply the sensed signal to the sensing line SL.

The source electrode SE3 of the third transistor ST3 may be connected to the seventh connection electrode BE7 of the third metal layer SDL through the thirty-second contact hole CNT32. The seventh connection electrode BE7 may be connected to the source electrode SE1 of the first transistor ST1 through the twenty-seventh contact hole CNT27, be connected to the second capacitor electrode CPE2 of the first metal layer BML through the twenty-eighth contact hole CNT28, and be connected to the first electrode RME1 of the third pixel SP3 through the thirty-eighth contact hole CNT38.

In FIG. 8, the sensing line SL, the first to third data lines DL1, DL2, and DL3, and the vertical voltage line VVSL may be disposed side by side on the right side of the pixel circuits of the first to third pixels in a plan view. Each of the sensing line SL, the first to third data lines DL1, DL2, and DL3, and the vertical voltage line VVSL may be one of first to fifth metal lines, but is not limited thereto. The sensing line SL, the second data line DL2, and the vertical voltage line VVSL may be disposed at the first metal layer BML, and the first and third data lines DL1 and DL3 may be disposed at the second metal layer GTL. Lines adjacent to each other in a plan view among the sensing line SL, the first to third data lines DL1, DL2, and DL3, and the vertical voltage line VVSL may be disposed at different metal layers. For example, the sensing line SL, the first to third data lines DL1, DL2, and DL3, and the vertical voltage line VVSL may be alternately disposed at the first and second metal layers BML and GTL. A distance L1 between the sensing line SL and the first data line DL1 in a cross-sectional view may be greater than a distance L2 between the sensing line SL and the first data line DL1 in a plan view. A distance L1 between the third data line DL3 and the vertical voltage line VVSL in a cross-sectional view may be greater than a distance L2 between the third data line DL3 and the vertical voltage line VVSL in a plan view. The first and third data lines DL1 and DL3 may be disposed at the second metal layer GTL, such that a distance L3 between the sensing line SL and the second data line DL2 disposed at the first metal layer BML may increase and a distance L3 between the second data line DL2 and the vertical voltage line VVSL disposed at the first metal layer BML may increase.

Accordingly, in the display device, it is possible to increase an actual distance L1 between adjacent metal lines in a cross-sectional view while decreasing a distance L2 between the metal lines in a plan view. A manufacturing process of the display device may be readily performed by dispersing a pattern density of the metal lines in a high-resolution display device as compared with a case where all of the sensing line SL, the first to third data lines DL1, DL2, and DL3, and the vertical voltage line VVSL are disposed at a same layer. In the display device, the distance L2 between the metal lines in a plan view may be relatively decreased, and the distance L3 between the metal lines disposed at the first metal layer BML may be relatively increased, such that space utilization of the pixel area may be increased. In the display device, it is possible to prevent a short-circuit defect by disposing the adjacent metal lines at different metal layers.

Figure 9:
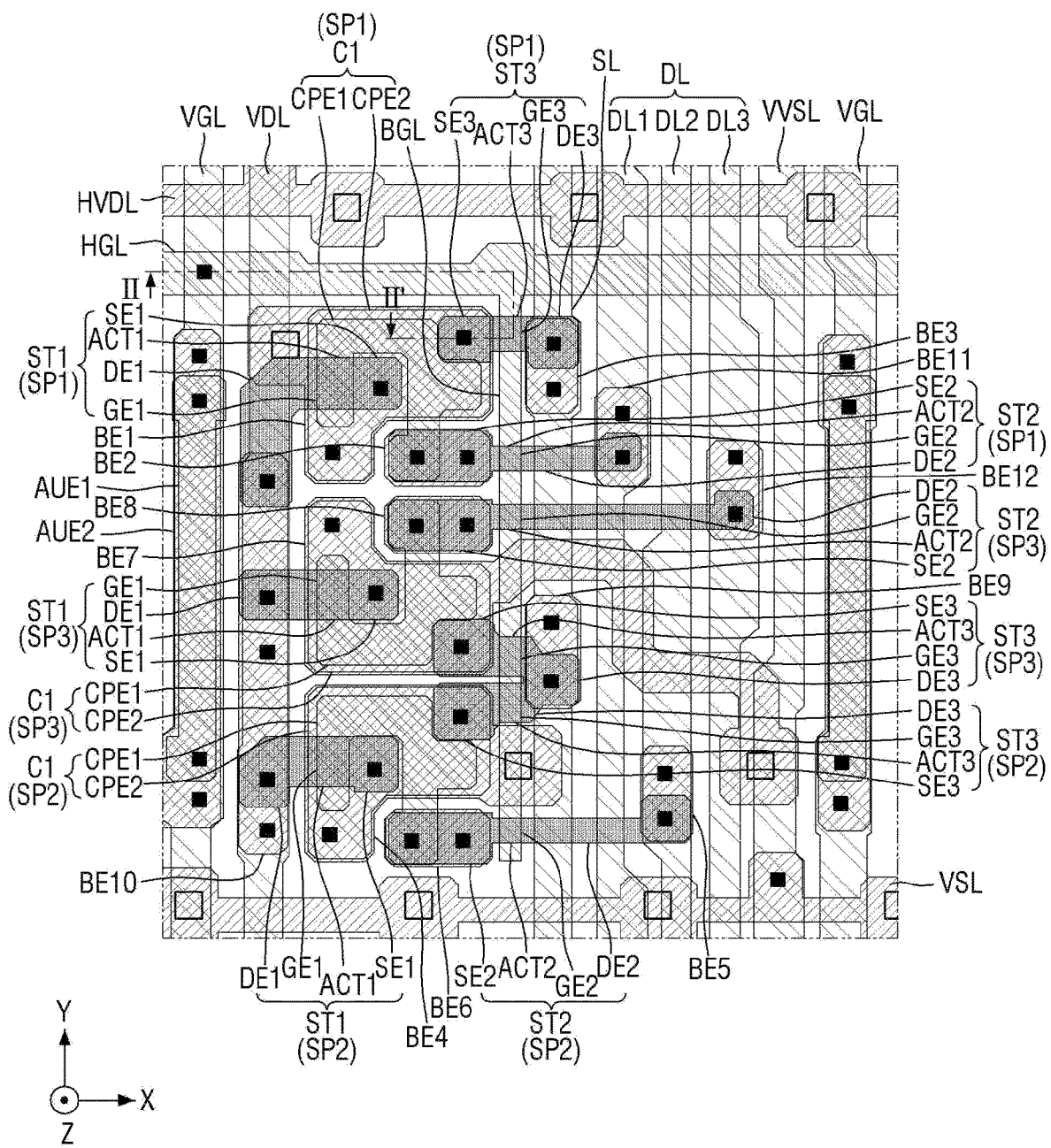
FIG. 9 is a plan view illustrating a pixel of a display device according to another embodiment.
Figure 10:
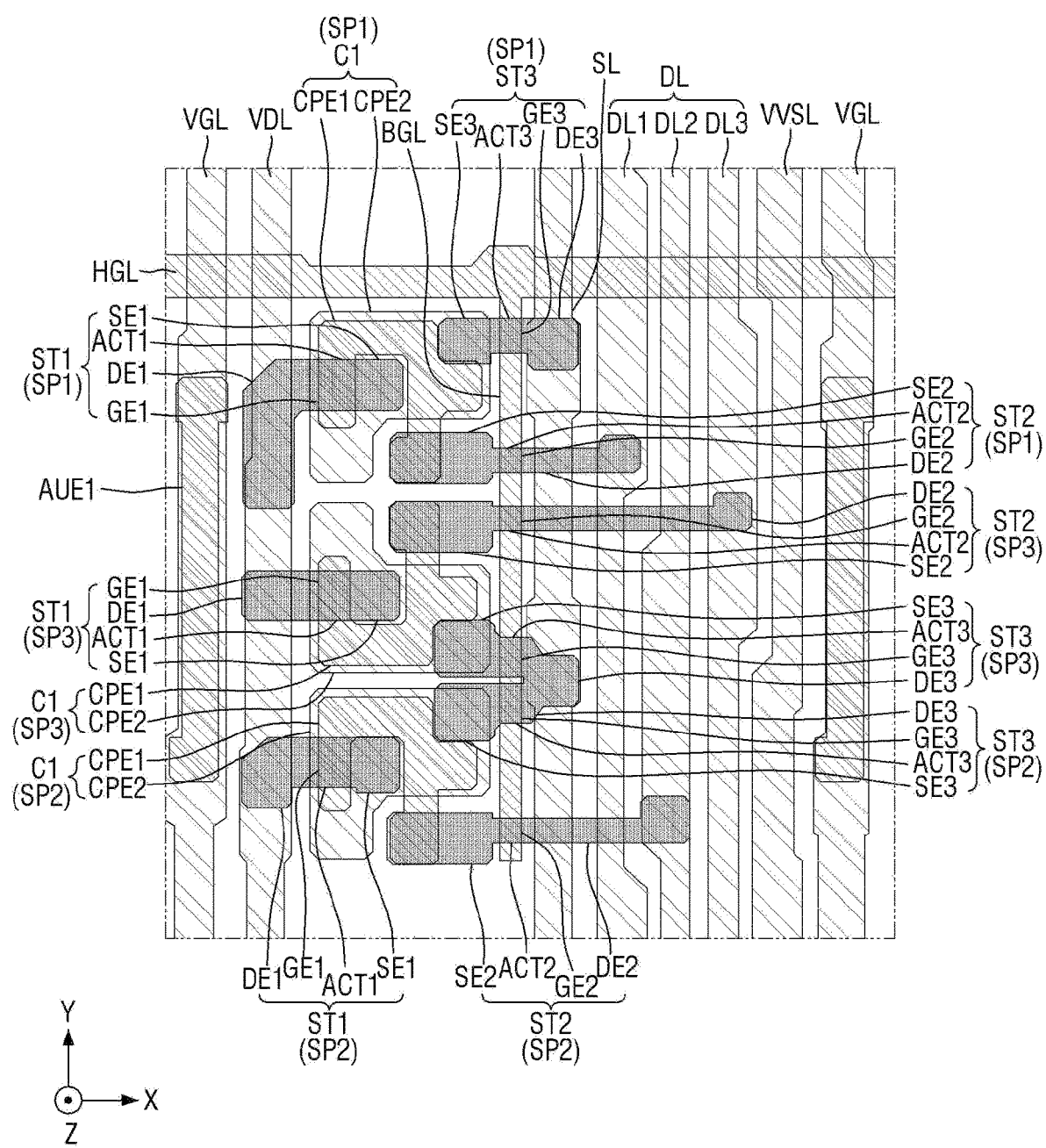
FIG. 10 is a plan view illustrating a metal layer, an active layer, and a gate layer in the display device of FIG. 9.
Figure 11:
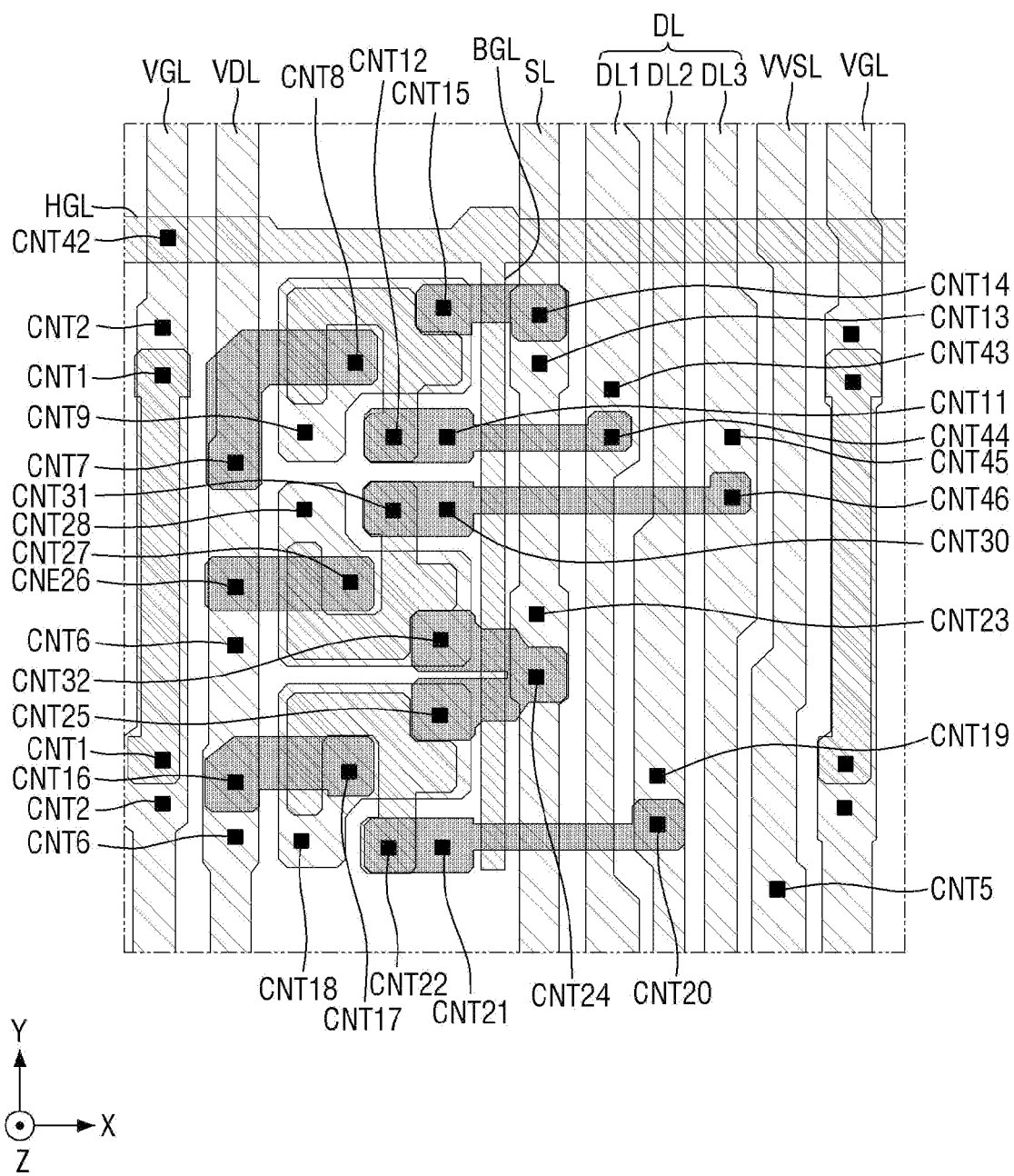
FIG. 11 is a plan view illustrating a metal layer, an active layer, a gate layer, and contact holes in the display device of FIG. 9.
Figure 12:
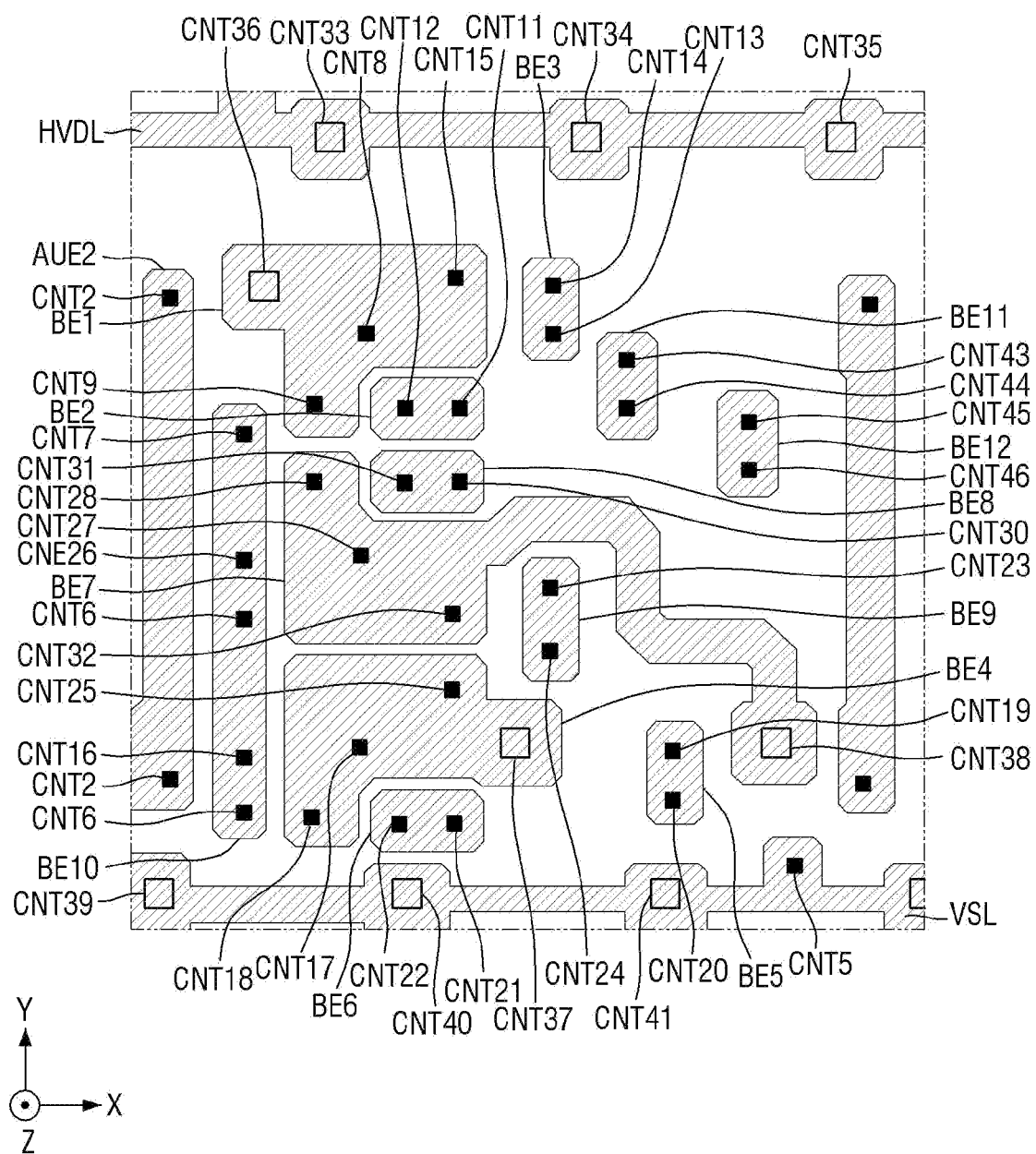
FIG. 12 is a plan view illustrating a source-drain layer and contact holes in the display device of FIG. 9.

FIG. 9 is a plan view illustrating a pixel of a display device according to another embodiment, and FIG. 10 is a plan view illustrating a metal layer, an active layer, and a gate layer in the display device of FIG. 9. FIG. 11 is a plan view illustrating a metal layer, an active layer, a gate layer, and contact holes in the display device of FIG. 9, and FIG.

Figure 13:
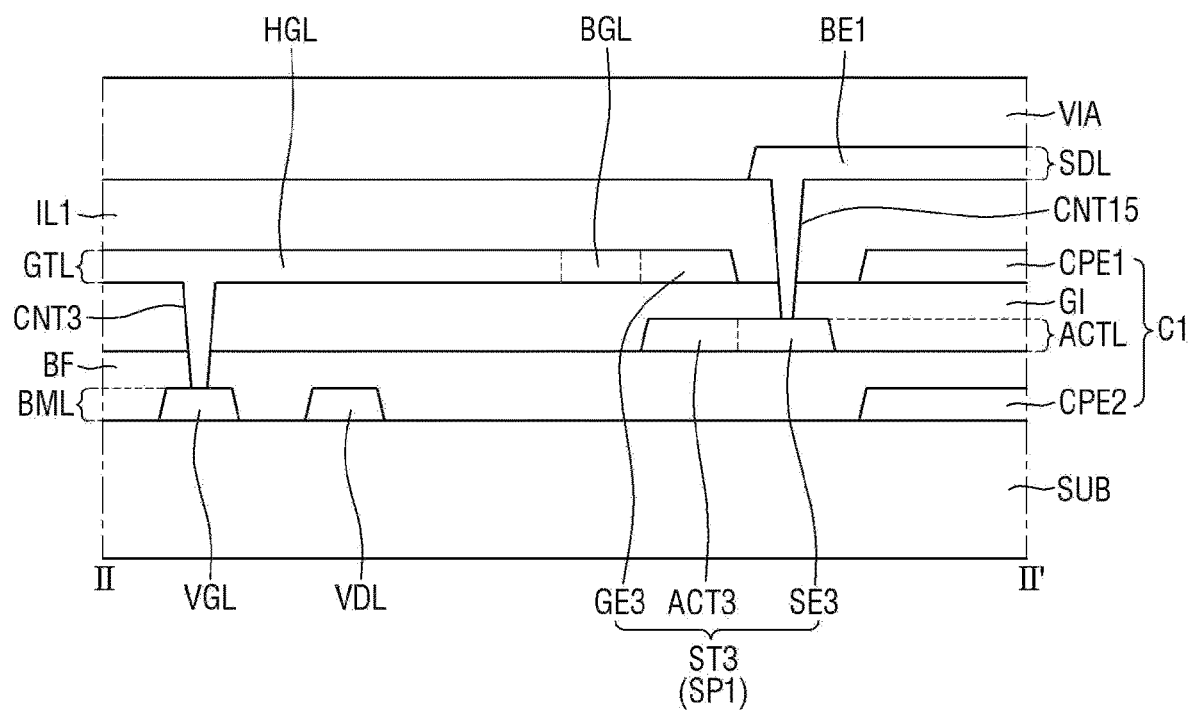
FIG. 13 is a schematic cross-sectional view taken along line II-II' of FIG. 9.

12 is a plan view illustrating a source-drain layer and contact holes in the display device of FIG. 9. FIG. 13 is a schematic cross-sectional view taken along line II-II' of FIG. 9. The embodiment of FIGS. 9 to 13 is different in configurations of the horizontal gate line HGL and the first and third data lines DL1 and DL3 from the embodiment of FIGS. 4 to 8, and the same configurations as the above-described configurations will be briefly described or a description thereof will be omitted.

Referring to FIGS. 9 to 13, the first voltage line VDL may be disposed at the first metal layer BML. The first voltage line VDL may be disposed on a side or the left side of the pixel circuits of the first to third pixels SP1, SP2, and SP3. The first voltage line VDL may be connected to a tenth connection electrode BE10 through a sixth contact hole CNT6. The first voltage line VDL may supply the driving voltage to the pixel circuit of each of the first to third pixels SP1, SP2, and SP3 through the tenth connection electrode BE10.

The vertical gate line VGL may be disposed at the first metal layer BML. The vertical gate line VGL may be disposed on a side or the left side of the first voltage line VDL. The vertical gate line VGL may be connected to the first and second auxiliary electrodes AUE1 and AUE2 to decrease line resistance.

The horizontal gate line HGL may be disposed at the second metal layer GTL. The horizontal gate line HGL may be disposed on the upper side of the pixel circuit of the first pixel SP1. The horizontal gate line HGL may be connected to the vertical gate line VGL through a forty-second contact hole CNT42. The horizontal gate line HGL and the auxiliary gate line BGL may be integral with each other formed at the same layer. Accordingly, in the display device 10, the horizontal gate line HGL and the auxiliary gate line BGL may be connected to each other without a separate contact hole, and a design margin may be secured. In the display device 10, it is possible to prevent a contact defect between different metal layers by forming the horizontal gate line HGL and the auxiliary gate line BGL at the same layer. The horizontal gate line HGL may supply the gate signal received from the vertical gate line VGL to the auxiliary gate line BGL.

The auxiliary gate line BGL may be disposed at the second metal layer GTL. The auxiliary gate line BGL may be disposed on another side or the right side of the pixel circuits of the first to third pixels SP1, SP2, and SP3. The auxiliary gate line BGL may branch from the horizontal gate line HGL and extend in the direction opposite to the second direction (Y-axis direction). The auxiliary gate line BGL may be formed integrally with the horizontal gate line HGL, and may thus be connected to the horizontal gate line HGL without a separate contact hole. The auxiliary gate line BGL may supply the gate signal received from the horizontal gate line HGL to the pixel circuits of the first to third pixels SP1, SP2, and SP3.

The horizontal voltage line HVDL may be disposed at the third metal layer SDL. The horizontal voltage line HVDL may be disposed on the upper side of the horizontal gate line HGL. The horizontal voltage line HVDL may receive the driving voltage from the first voltage line VDL. The horizontal voltage line HVDL may supply the driving voltage to alignment electrode (RMEa in FIG. 19) of each of the first to third pixels SP1, SP2, and SP3.

The vertical voltage line VVSL may be disposed at the first metal layer BML. The vertical voltage line VVSL may be disposed on another side or the right side of the third data line DL3. The vertical voltage line VVSL may be connected to the second voltage line VSL of the third metal layer SDL through a fifth contact hole CNT5. Accordingly, the vertical voltage line VVSL may supply the low potential voltage to the second voltage line VSL.

The second voltage line VSL may be disposed at the third metal layer SDL. The second voltage lines VSL may be disposed on the lower side of the pixel circuit of the second pixel SP2. The second voltage line VSL may supply the low potential voltage received from the vertical voltage line VVSL to a second electrode (RME2 in FIG. 19) of each of the first to third pixels SP1, SP2, and SP3.

The sensing line SL may be disposed at the first metal layer BML. The sensing line SL may be disposed on another side or the right side of the auxiliary gate line BGL. The sensing line SL may be connected to a third connection electrode BE3 through a thirteenth contact hole CNT13. The third connection electrode BE3 may be connected to a drain electrode DE3 of a third transistor ST3 of the first pixel SP1 through a fourteenth contact hole CNT14. The sensing line SL may be connected to a ninth connection electrode BE9 through a twenty-third contact hole CNT23. The ninth connection electrode BE9 may be connected to a drain electrode DE3 of a third transistor ST3 of the second pixel SP2 and a drain electrode DE3 of a third transistor ST3 of the third pixel SP3 through a twenty-fourth contact hole CNT24. Accordingly, the sensing line SL may supply the initialization voltage to the third transistor ST3 of each of the first to third pixels SP1, SP2, and SP3 and receive a sensed signal from the third transistor ST3 of the first to third pixels SP1, SP2, and SP3.

The first data line DL1 may be disposed at the first metal layer BML. The first data line DL1 may be disposed on another side or the right side of the sensing line SL. The first data line DL1 may be connected to an eleventh connection electrode BE11 through a forty-third contact hole CNT43, and the eleventh connection electrode BE11 may be connected to a drain electrode DE2 of a second transistor ST2 of the first pixel SP1 through a forty-fourth contact hole CNT44. Accordingly, the first data line DL1 may supply the data voltage to the second transistor ST2 of the first pixel SP1.

The second data line DL2 may be disposed at the first metal layer BML. The second data line DL2 may be disposed on another side or the right side of the first data line DL1. The second data line DL2 may be connected to a fifth connection electrode BE5 of the third metal layer SDL through a nineteenth contact hole CNT19, and the fifth connection electrode BE5 may be connected to a drain electrode DE2 of a second transistor ST2 of the second pixel SP2 through a twentieth contact hole CNT20. Accordingly, the second data line DL2 may supply the data voltage to the second transistor ST2 of the second pixel SP2.

The third data line DL3 may be disposed at the first metal layer BML. The third data line DL3 may be disposed on another side or the right side of the second data line DL2. The third data line DL3 may be connected to a twelfth connection electrode BE12 through a forty-fifth contact hole CNT45, and the twelfth connection electrode BE12 may be connected to a drain electrode DE2 of a second transistor ST2 of the third pixel SP3 through a forty-sixth contact hole CNT46. Accordingly, the third data line DL3 may supply the data voltage to the second transistor ST2 of the third pixel SP3.

Figure 14:
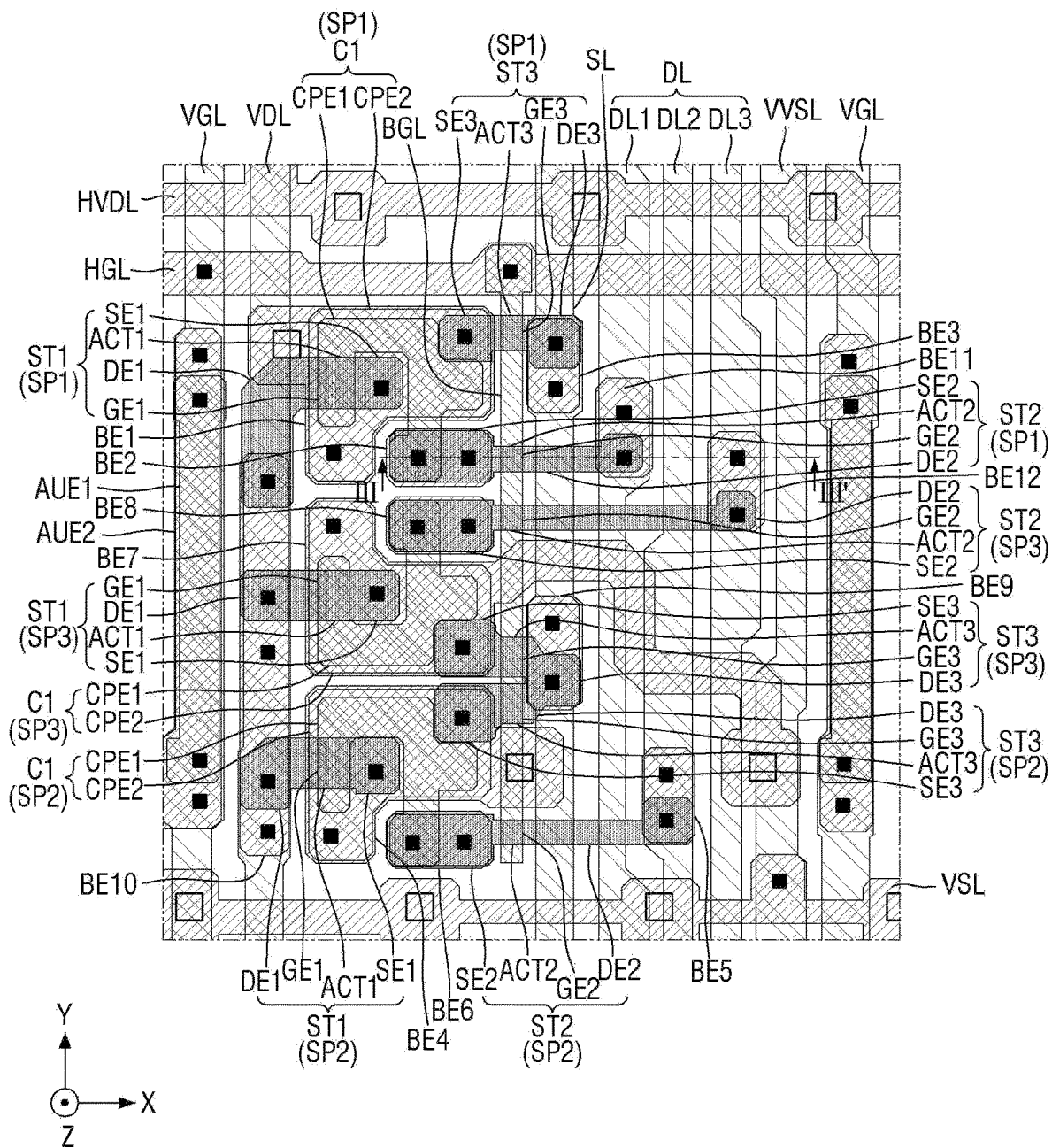
FIG. 14 is a plan view illustrating a pixel of a display device according to still another embodiment.
Figure 15:
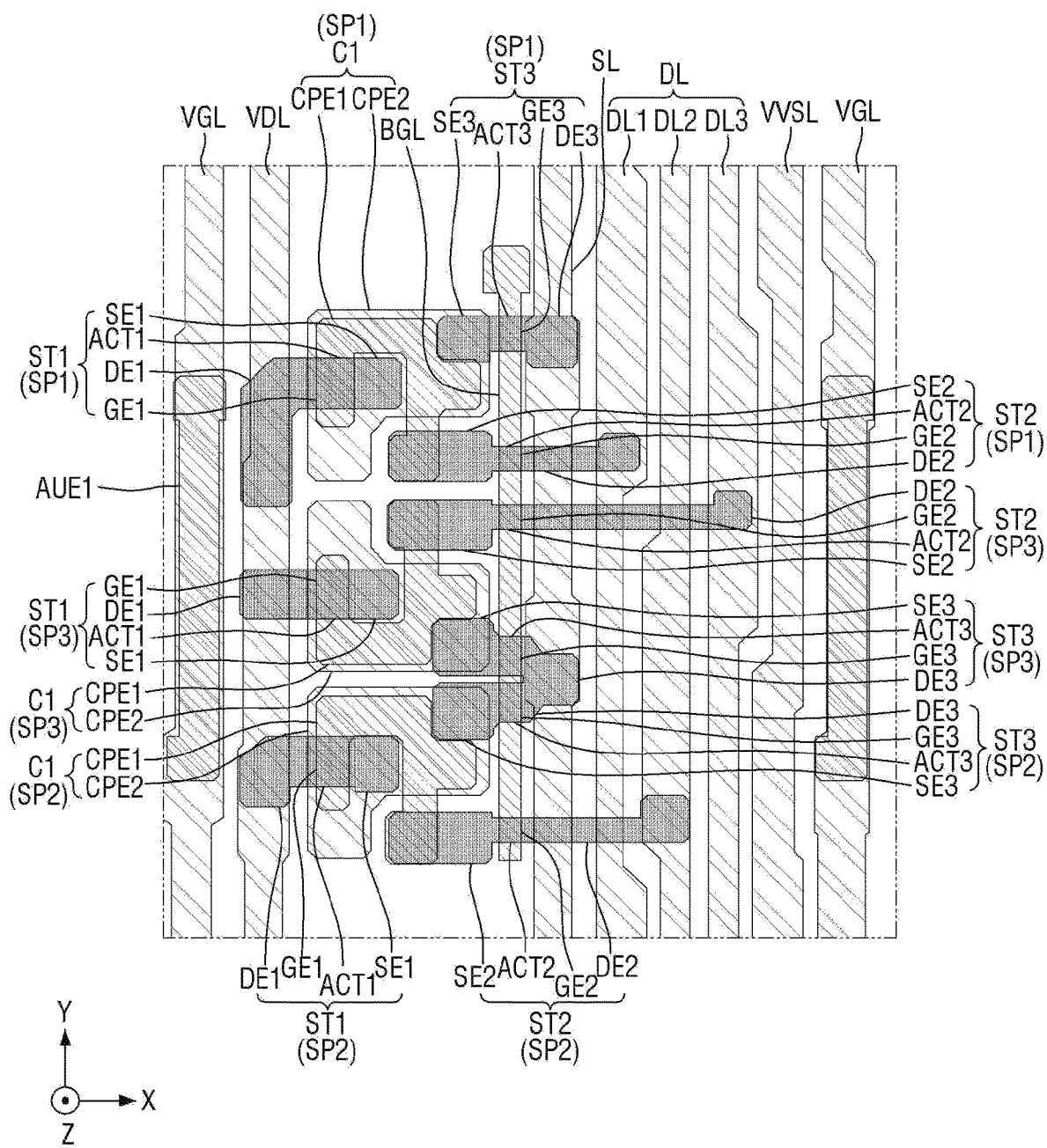
FIG. 15 is a plan view illustrating a metal layer, an active layer, and a gate layer in the display device of FIG. 14.
Figure 16:
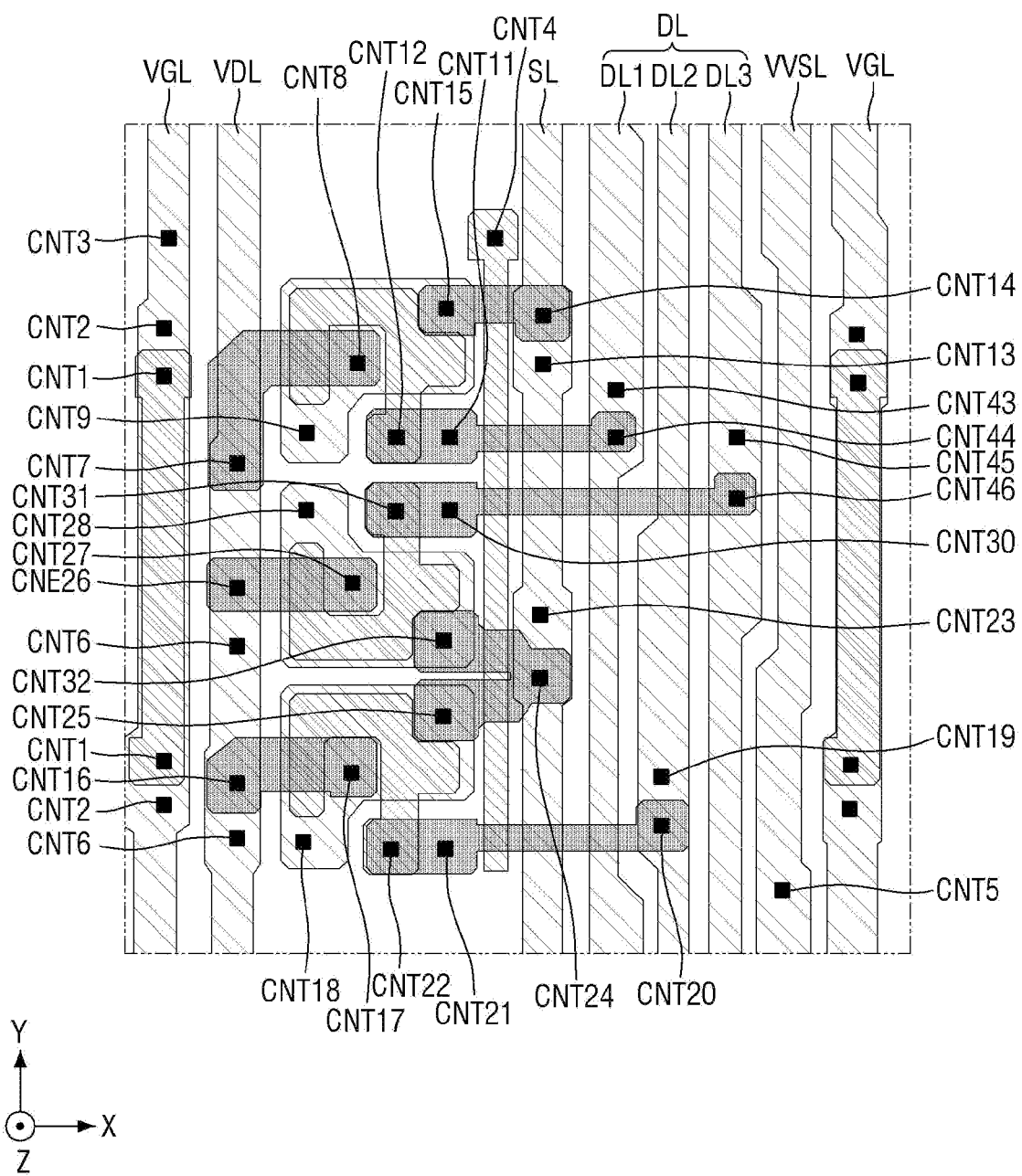
FIG. 16 is a plan view illustrating a metal layer, an active layer, a gate layer, and contact holes in the display device of FIG. 14.
Figure 17:
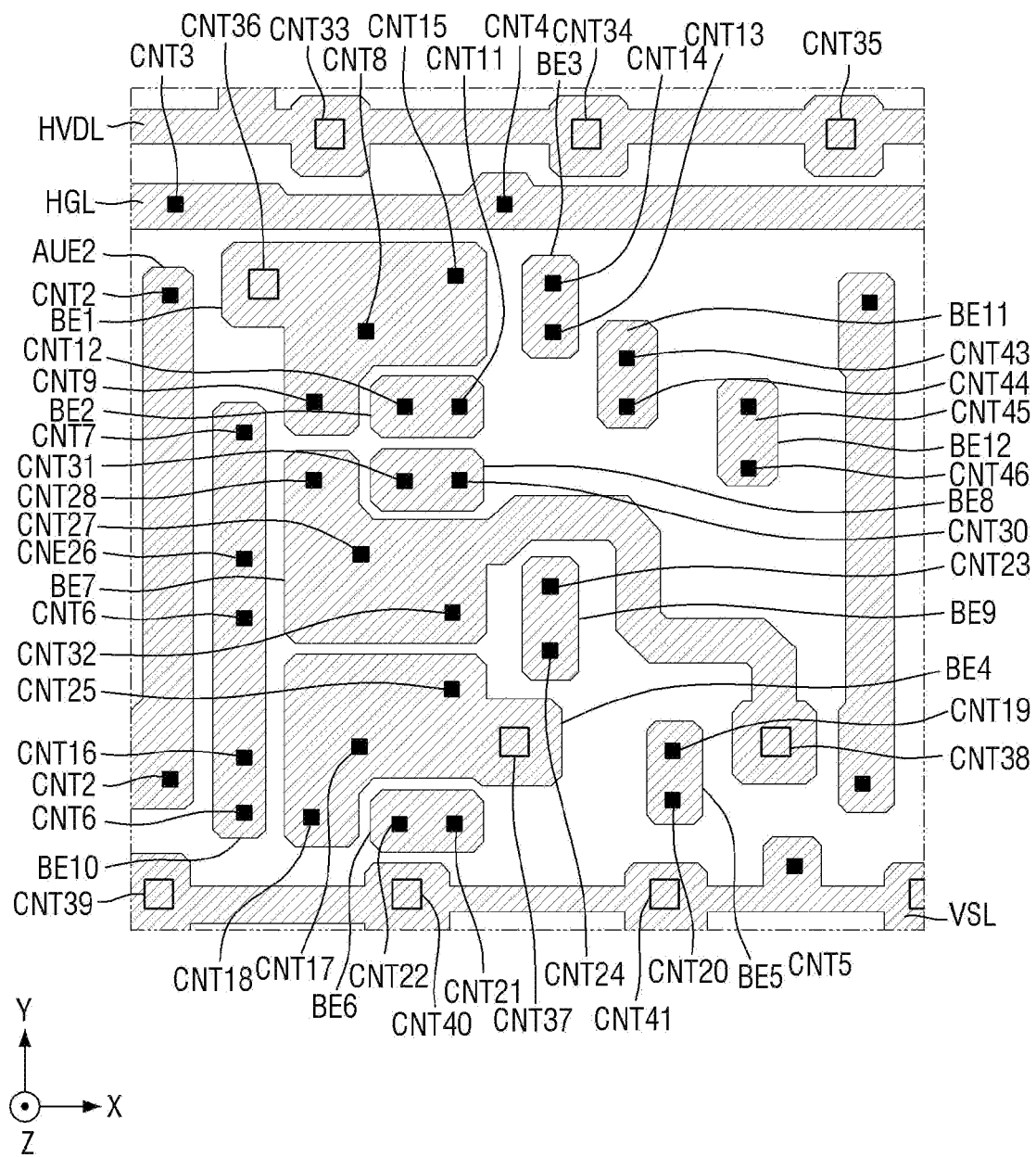
FIG. 17 is a plan view illustrating a source-drain layer and contact holes in the display device of FIG. 14.
Figure 18:
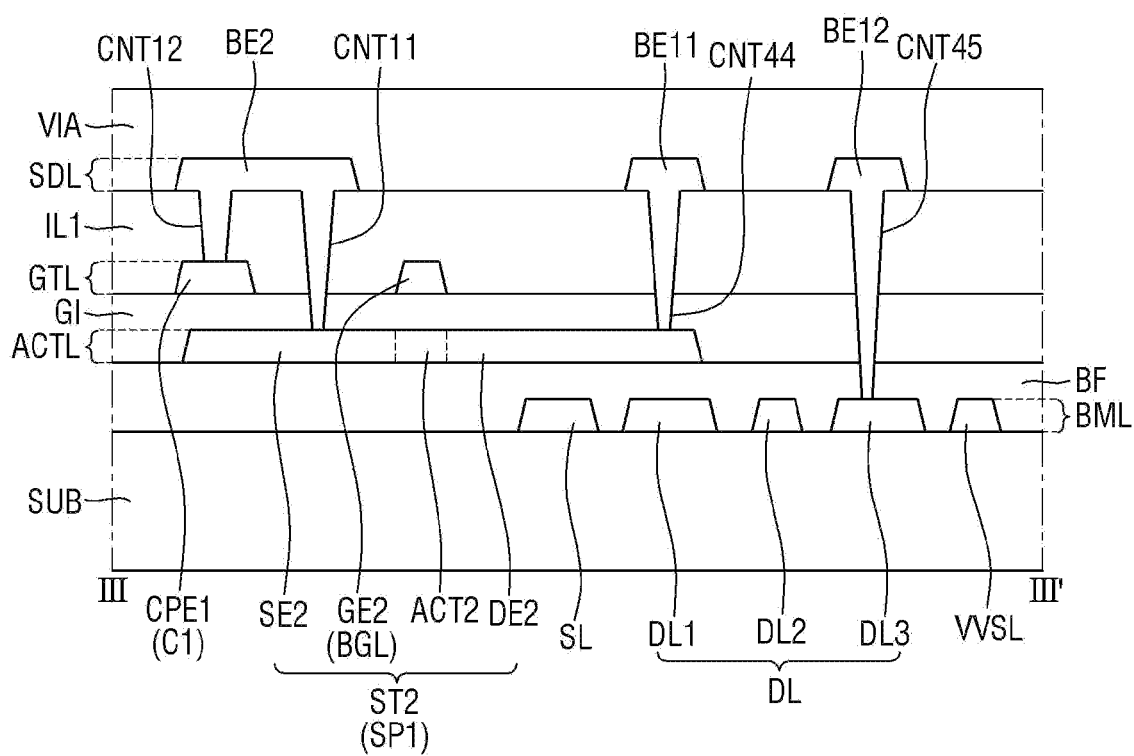
FIG. 18 is a schematic cross-sectional view taken along line III-III' of FIG. 14.

FIG. 14 is a plan view illustrating a pixel of a display device according to still another embodiment, and FIG. 15 is a plan view illustrating a metal layer, an active layer, and a gate layer in the display device of FIG. 14. FIG. 16 is a plan view illustrating a metal layer, an active layer, a gate layer, and contact holes in the display device of FIG. 14, and FIG. 17 is a plan view illustrating a source-drain layer and contact holes in the display device of FIG. 14. FIG. 18 is a schematic cross-sectional view taken along line III-III' of FIG. 14. The embodiment of FIGS. 14 to 18 is different in configurations of the first and third data lines DL1 and DL3 from the embodiment of FIGS. 4 to 8, and the same configurations as the above-described configurations will be briefly described or a description thereof will be omitted.

Referring to FIGS. 14 to 18, the first voltage line VDL may be disposed at the first metal layer BML. The first voltage line VDL may be disposed on a side or the left side of the pixel circuits of the first to third pixels SP1, SP2, and SP3. The first voltage line VDL may be connected to a tenth connection electrode BE10 through a sixth contact hole CNT6. The first voltage line VDL may supply the driving voltage to the pixel circuit of each of the first to third pixels SP1, SP2, and SP3 through the tenth connection electrode BE10.

The vertical gate line VGL may be disposed at the first metal layer BML. The vertical gate line VGL may be disposed on a side or the left side of the first voltage line VDL. The vertical gate line VGL may be connected to the first and second auxiliary electrodes AUE1 and AUE2 to decrease line resistance.

The horizontal gate line HGL may be disposed at the third metal layer SDL. The horizontal gate line HGL may be disposed on the upper side of the pixel circuit of the first pixel SP1. The horizontal gate line HGL may be connected between the vertical gate line VGL and the auxiliary gate line BGL. The horizontal gate line HGL may be connected to the vertical gate line VGL through a third contact hole CNT3, and may be connected to the auxiliary gate line BGL through a fourth contact hole CNT4. The horizontal gate line HGL may supply the gate signal received from the vertical gate line VGL to the auxiliary gate line BGL.

The auxiliary gate line BGL may be disposed at the second metal layer GTL. The auxiliary gate line BGL may be disposed on another side or the right side of the pixel circuits of the first to third pixels SP1, SP2, and SP3. The auxiliary gate line BGL may supply the gate signal received from the horizontal gate line HGL to the pixel circuits of the first to third pixels SP1, SP2, and SP3.

The horizontal voltage line HVDL may be disposed at the third metal layer SDL. The horizontal voltage line HVDL may be disposed on the upper side of the horizontal gate line HGL. The horizontal voltage line HVDL may receive the driving voltage from the first voltage line VDL. The horizontal voltage line HVDL may supply the driving voltage to an alignment electrode (RMEa in FIG. 19) of each of the first to third pixels SP1, SP2, and SP3.

The vertical voltage line VVSL may be disposed at the first metal layer BML. The vertical voltage line VVSL may be disposed on another side or the right side of the third data line DL3. The vertical voltage line VVSL may be connected to the second voltage line VSL of the third metal layer SDL through a fifth contact hole CNT5. Accordingly, the vertical voltage line VVSL may supply the low potential voltage to the second voltage line VSL.

The second voltage line VSL may be disposed at the third metal layer SDL. The second voltage lines VSL may be disposed on the lower side of the pixel circuit of the second pixel SP2. The second voltage line VSL may supply the low potential voltage received from the vertical voltage line VVSL to a second electrode (RME2 in FIG. 19) of each of the first to third pixels SP1, SP2, and SP3.

The sensing line SL may be disposed at the first metal layer BML. The sensing line SL may be disposed on another side or the right side of the auxiliary gate line BGL. The sensing line SL may be connected to a third connection electrode BE3 through a thirteenth contact hole CNT13. The third connection electrode BE3 may be connected to a drain electrode DE3 of a third transistor ST3 of the first pixel SP1 through a fourteenth contact hole CNT14. The sensing line SL may be connected to a ninth connection electrode BE9 through a twenty-third contact hole CNT23. The ninth connection electrode BE9 may be connected to a drain electrode DE3 of a third transistor ST3 of the second pixel SP2 and a drain electrode DE3 of a third transistor ST3 of the third pixel SP3 through a twenty-fourth contact hole CNT24. Accordingly, the sensing line SL may supply the initialization voltage to the third transistor ST3 of each of the first to third pixels SP1, SP2, and SP3 and receive a sensed signal from the third transistor ST3 of the first to third pixels SP1, SP2, and SP3.

The first data line DL1 may be disposed at the first metal layer BML. The first data line DL1 may be disposed on another side or the right side of the sensing line SL. The first data line DL1 may be connected to an eleventh connection electrode BE11 through a forty-third contact hole CNT43, and the eleventh connection electrode BE11 may be connected to a drain electrode DE2 of a second transistor ST2 of the first pixel SP1 through a forty-fourth contact hole CNT44. Accordingly, the first data line DL1 may supply the data voltage to the second transistor ST2 of the first pixel SP1.

The second data line DL2 may be disposed at the first metal layer BML. The second data line DL2 may be disposed on another side or the right side of the first data line DL1. The second data line DL2 may be connected to a fifth connection electrode BE5 of the third metal layer SDL through a nineteenth contact hole CNT19, and the fifth connection electrode BE5 may be connected to a drain electrode DE2 of a second transistor ST2 of the second pixel SP2 through a twentieth contact hole CNT20. Accordingly, the second data line DL2 may supply the data voltage to the second transistor ST2 of the second pixel SP2.

The third data line DL3 may be disposed at the first metal layer BML. The third data line DL3 may be disposed on another side or the right side of the second data line DL2. The third data line DL3 may be connected to a twelfth connection electrode BE12 through a forty-fifth contact hole CNT45, and the twelfth connection electrode BE12 may be connected to a drain electrode DE2 of a second transistor ST2 of the third pixel SP3 through a forty-sixth contact hole CNT46. Accordingly, the third data line DL3 may supply the data voltage to the second transistor ST2 of the third pixel SP3.

Figure 19:
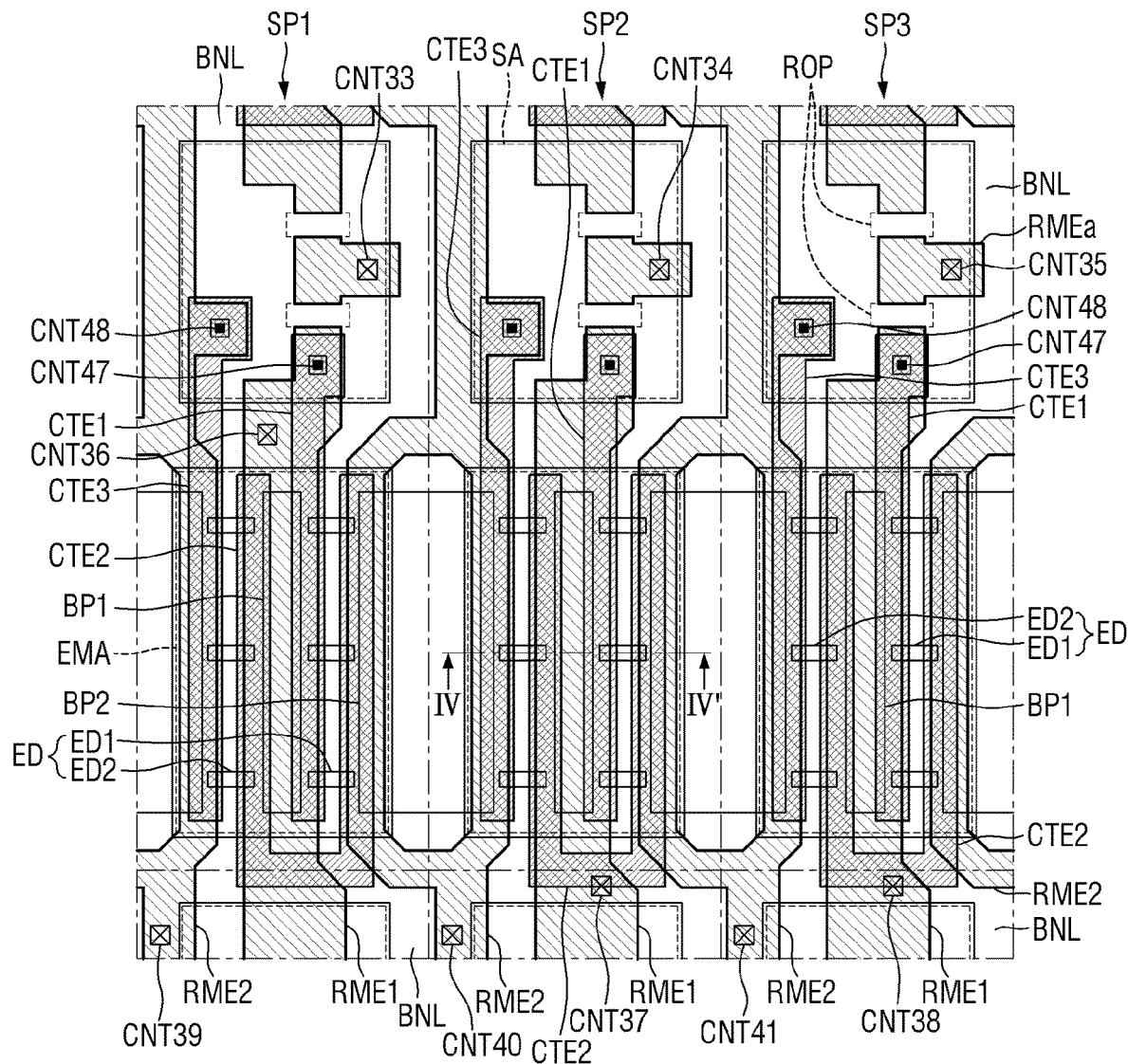
FIG. 19 is a plan view illustrating a light emitting element layer of the display device according to an embodiment.
Figure 20:
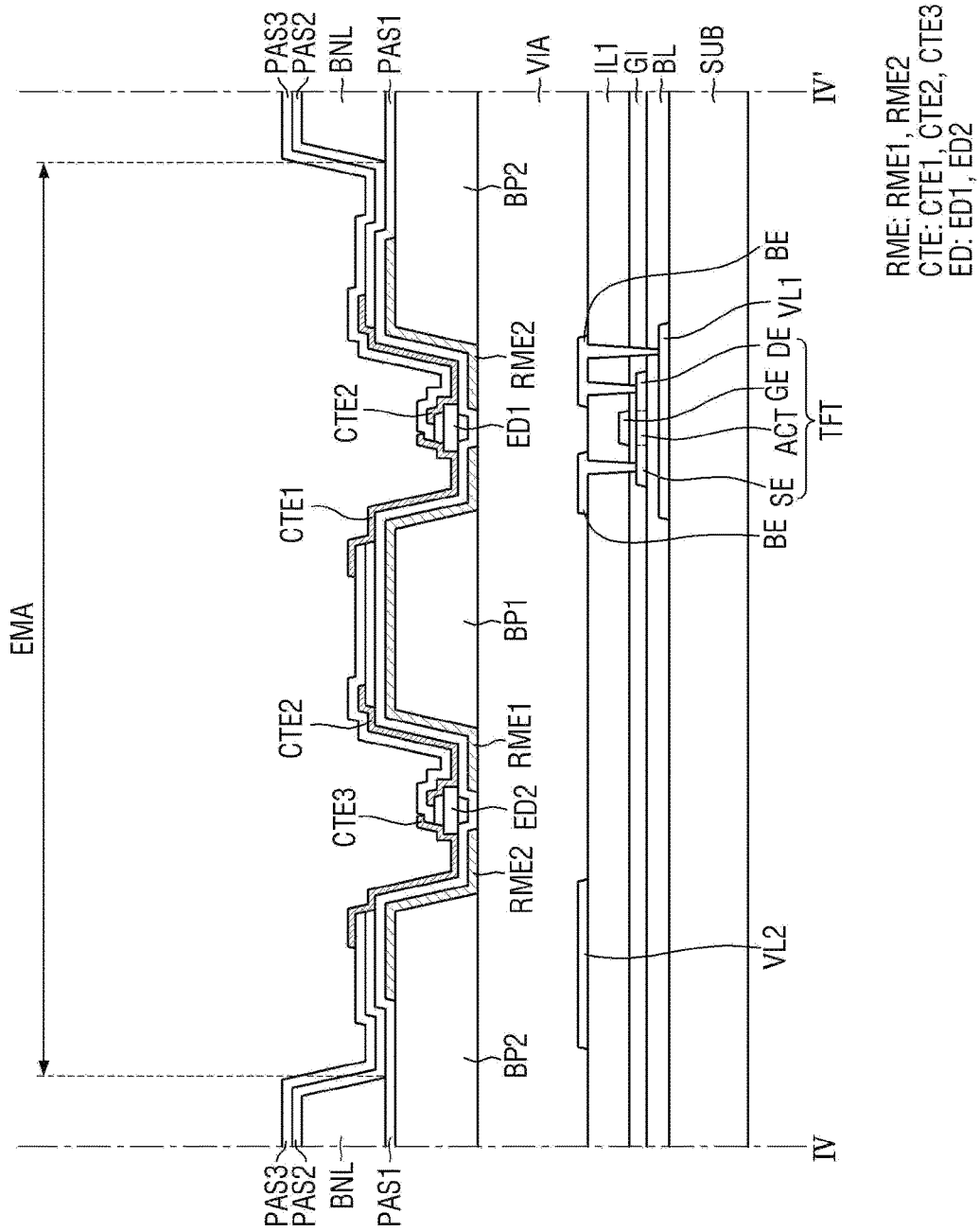
FIG. 20 is a schematic cross-sectional view taken along line IV-IV' of FIG. 19.

FIG. 19 is a plan view illustrating a light emitting element layer of the display device according to an embodiment, and FIG. 20 is a schematic cross-sectional view taken along line IV-IV' of FIG. 19.

Referring to FIGS. 19 and 20, the light emitting element layer of the display device may include first and second bank patterns BP1 and BP2, first and second electrodes RME: RME1 and RME2, a first insulating film PAS1, a bank layer BNL, a second insulating film PAS2, first to third contact electrodes CTE: CTE1, CTE2, and CTE3, and a third insulating film PASS.

The first bank pattern BP1 may be disposed at a central portion of an emission area EMA, and the second bank patterns BP2 may be spaced apart from each other with the first bank pattern BP1 interposed therebetween. The first and second bank patterns BP1 and BP2 may be alternately disposed in the first direction (X-axis direction). Multiple light emitting elements ED may be disposed between the first and second bank patterns BP1 and BP2 spaced apart from each other.

The first bank pattern BP1 and the second bank pattern BP2 may have the same length in the second direction (Y-axis direction), and may have different lengths in the first direction (X-axis direction). A portion of the bank layer BNL extending in the second direction (Y-axis direction) may overlap the second bank pattern BP2 in the thickness direction. The first and second bank patterns BP1 and BP2 may be disposed in an island-shaped pattern in the display area DA.

The first and second electrodes RME1 and RME2 of each of the first to third pixels SP1, SP2, and SP3 may be disposed on the via layer VIA. The first electrode RME1 of the first pixel SP1 may extend in the second direction (Y-axis direction) at the center of the first pixel SP1. The second electrodes RME2 of the first pixel SP1 may extend in the second direction (Y-axis direction) on the left side of the first pixel SP1 and the right side of the third pixel SP3. The first electrode RME1 of the second pixel SP2 may extend in the second direction (Y-axis direction) at the center of the second pixel SP2. The second electrodes RME2 of the second pixel SP2 may extend in the second direction (Y-axis direction) on the left side of the second pixel SP2 and the right side of the first pixel SP1. The first electrode RME1 of the third pixel SP3 may extend in the second direction (Y-axis direction) at the center of the third pixel SP3. The second electrodes RME2 of the third pixel SP3 may extend in the second direction (Y-axis direction) on the left side of the third pixel SP3 and the right side of the second pixel SP2. The second electrode RME2 disposed on the right side of the first pixel SP1 and the second electrode RME2 disposed on the left side of the second pixel SP2 may be integral with each other. The second electrode RME2 disposed on the right side of the second pixel SP2 and the second electrode RME2 disposed on the left side of the third pixel SP3 may be integral with each other.

One ends of the first electrodes RME1 of each of the first to third pixels SP1, SP2, and SP3 may be separated from alignment electrodes RMEa by separation parts ROP. Here, the alignment electrodes RMEa may be portions connected to the horizontal voltage line HVDL through the thirty-third to thirty-fifth contact holes CNT33, CNT34, and CNT35, and the alignment electrodes RMEa and the first electrodes RME1 may be connected to each other in an alignment process of the light emitting elements ED. The alignment electrodes RMEa and the first electrodes RME1 may be separated from each other by the separation parts ROP after the alignment process of the light emitting elements ED is completed.

Multiple first light emitting elements ED1 may be aligned between the first electrode RME1 and the second electrode RME2 on the right side. The first insulating film PAS1 may cover the first and second electrodes RME1 and RME2. The first light emitting elements ED1 may be insulated from the first and second electrodes RME1 and RME2 by the first insulating film PAS1. Before the first electrode RME1 and the alignment electrode RMEa are separated by the separation part ROP, each of the first and second electrodes RME1 and RME2 may receive an alignment signal, and an electric field may be formed between the first and second electrodes RME1 and RME2. For example, the first light emitting elements ED1 may be jetted onto the first and second electrodes RME1 and RME2 through an inkjet printing process, and the first light emitting elements ED1 dispersed in ink may be aligned by a dielectrophoresis force by the electric field formed between the first and second electrodes RME1 and RME2.

Multiple second light emitting elements ED2 may be aligned between the first electrode RME1 and the second electrode RME2 on the left side. Before the first electrode RME1 and the alignment electrode RMEa are separated by the separation part ROP, each of the first and second electrodes RME1 and RME2 may receive an alignment signal, and an electric field may be formed between the first and second electrodes RME1 and RME2. For example, the second light emitting elements ED2 may be jetted onto the first and second electrodes RME1 and RME2 through an inkjet printing process, and the second light emitting elements ED2 dispersed in ink may be aligned by a dielectrophoresis force by the electric field formed between the first and second electrodes RME1 and RME2.

The first electrode RME1 of the first pixel SP1 may be connected to the first connection electrode BE1 of the third metal layer SDL through the thirty-sixth contact hole CNT36. The first electrode RME1 may receive the driving current through the first transistor ST1 from the first connection electrode BE1. The first electrode RME1 may supply the driving current to the first light emitting elements ED1 of the first pixel SP1.

The second electrode RME2 of the first pixel SP1 may be connected to the second voltage line VSL of the third metal layer SDL through the thirty-ninth contact hole CNT39. Accordingly, the second electrode RME2 of the first pixel SP1 may receive the low potential voltage from the second voltage line VSL.

The first electrode RME1 of the second pixel SP2 may be connected to the fourth connection electrode BE4 of the third metal layer SDL through the thirty-seventh contact hole CNT37. The first electrode RME1 may receive the driving current through the first transistor ST1 from the fourth connection electrode BE4. The first electrode RME1 may supply the driving current to the first light emitting elements ED1 of the second pixel SP2.

The second electrode RME2 of the second pixel SP2 may be connected to the second voltage line VSL of the third metal layer SDL through the fortieth contact hole CNT40. Accordingly, the second electrode RME2 of the second pixel SP2 may receive the low potential voltage from the second voltage line VSL.

The first electrode RME1 of the third pixel SP3 may be connected to the seventh connection electrode BE7 of the third metal layer SDL through the thirty-eighth contact hole CNT38. The first electrode RME1 may receive the driving current through the first transistor ST1 from the seventh connection electrode BE7. The first electrode RME1 may supply the driving current to the first light emitting elements ED1 of the third pixel SP3.

The second electrode RME2 of the third pixel SP3 may be connected to the second voltage line VSL of the third metal layer SDL through the forty-first contact hole CNT41. Accordingly, the second electrode RME2 of the third pixel SP3 may receive the low potential voltage from the second voltage line VSL.

The first to third contact electrodes CTE1, CTE2, and CTE3 of each of the first to third pixels SP1, SP2, and SP3 may be disposed on the first and second electrodes RME1 and RME2. The second insulating film PAS2 may be disposed on the bank layer BNL, the first insulating film PAS1, and a central portion of the light emitting element ED. The third insulating film PAS3 may cover the second contact electrode CTE2. The second and third insulating films PAS2 and PAS3 may insulate the first and second contact electrodes CTE1 and CTE2 from each other, and may insulate the second and third contact electrodes CTE2 and CTE3 from each other.

The first contact electrode CTE1 may be disposed on the first electrode RME1, and be connected to the first electrode RME1 through a forty-seventh contact hole CNT47. The first contact electrode CTE1 may be connected between the first electrode RME1 and the first light emitting elements ED1. The first contact electrode CTE1 may correspond to an anode electrode of each of the first light emitting elements ED1, but is not limited thereto.

The second contact electrode CTE2 may be disposed on the first and second electrodes RME1 and RME2, and be insulated from the first and second electrodes RME1 and RME2. A first portion of the second contact electrode CTE2 may be disposed on the second electrode RME2 on the right side in a plan view and extend in the second direction (the Y-axis direction). A second portion of the second contact electrode CTE2 may be bent from a lower side of the first portion and extend in a direction opposite to the first direction (X-axis direction). A third portion of the second contact electrode CTE2 may be bent from a left side of the second portion and extend in the second direction (Y-axis direction), and may be disposed on the first electrode RME1.

The second contact electrode CTE2 may be connected between the first light emitting elements ED1 and the second light emitting elements ED2. The second contact electrode CTE2 may correspond to the third node N3 of FIG. 3. The second contact electrode CTE2 may correspond to a cathode electrode of each of the first light emitting elements ED1, but is not limited thereto. The second contact electrode CTE2 may correspond to an anode electrode of each of the second light emitting elements ED2, but is not limited thereto.

The third contact electrode CTE3 may be disposed on the second electrode RME2 on the left side in a plan view, and be connected to the second electrode RME2 through a forty-eighth contact hole CNT48. The third contact electrode CTE3 may be connected between the second light emitting elements ED2 and the second electrode RME2. The third contact electrode CTE3 may correspond to a cathode electrode of each of the second light emitting elements ED2, but is not limited thereto. The third contact electrode CTE3 may receive the low potential voltage through the second electrode RME2.

The thin film transistor TFT may include an active region ACT, a gate electrode GE, the drain electrode DE, and a source electrode SE. The drain electrode DE of the thin film transistor TFT may receive the driving voltage from the first voltage line VDL of the first metal layer BML through a connection electrode BE. The source electrode SE of the thin film transistor TFT may be connected to the second electrode RME2 of the first to third pixels SP1, SP2, and SP3 through the connection electrode BE. Here, the thin film transistor TFT may constitute the pixel circuit of each of the first to third pixels SP1, SP2, and SP3.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a first pixel, a second pixel, and a third pixel, each disposed on a substrate and including a pixel circuit;
   a first metal line disposed at a first metal layer on the substrate, extending in a first direction on a first side of the pixel circuits of the first to third pixels, and electrically connected to at least one of the pixel circuits of the first to third pixels;
   a second metal line disposed at a second metal layer on the first metal layer, extending in the first direction on a first side of the first metal line, and electrically connected to at least one of the pixel circuits of the first to third pixels; and
   a third metal line disposed at the first metal layer, extending in the first direction on a first side of the second metal line, and electrically connected to at least one of the pixel circuits of the first to third pixels,
   wherein each of the first to third metal lines supplies a voltage to at least one of the pixel circuits of the first to third pixels, and
   wherein the first metal line and the third metal line are disposed at a same layer and formed of a same material.

2. The display device of claim 1, wherein the first metal line supplies an initialization voltage to the pixel circuits of the first to third pixels.

3. The display device of claim 1, wherein
   the second metal line supplies a first data voltage to the pixel circuit of the first pixel, and
   the third metal line supplies a second data voltage to the pixel circuit of the second pixel.

4. The display device of claim 1, wherein
   the second metal line is directly connected to the pixel circuit of the first pixel, and
   the third metal line is electrically connected to the pixel circuit of the second pixel through a connection electrode disposed at a third metal layer on the second metal layer.

5. The display device of claim 1, further comprising:
   a fourth metal line disposed at the second metal layer, extending in the first direction on a first side of the third metal line, and electrically connected to at least one of the pixel circuits of the first to third pixels,
   wherein the fourth metal line supplies a data voltage to the pixel circuit of the third pixel.

6. The display device of claim 5, further comprising:
   a fifth metal line disposed at the first metal layer and extending in the first direction on a first side of the fourth metal line.

7. The display device of claim 6, further comprising:
   a first voltage line disposed at the first metal layer, extending in the first direction on a second side of the pixel circuits of the first to third pixels opposite to the first side of the pixel circuits of the first to third pixels, and supplying a driving voltage to the pixel circuits of the first to third pixels.

8. The display device of claim 7, further comprising:
   a second voltage line disposed at a third metal layer on the second metal layer, extending in a second direction intersecting the first direction on a third side of one of the pixel circuits of the first to third pixels adjacent to the first side of the pixel circuits of the first to third pixels, and receiving a low potential voltage from the fifth metal line.

9. A display device comprising:
a first pixel, a second pixel, and a third pixel, each disposed on a substrate and including a pixel circuit;
a data line disposed at a first metal layer on the substrate, extending in a first direction on a first side of the pixel circuits of the first to third pixels, and electrically connected to at least one of the pixel circuits of the first to third pixels;
a vertical gate line disposed at the first metal layer and extending in the first direction on a second side of the pixel circuits of the first to third pixels opposite to the first side of the pixel circuits of the first to third pixels;
a horizontal gate line disposed at a second metal layer on the first metal layer and extending in a second direction intersecting the first direction on a third side of one of the pixel circuits of the first to third pixels adjacent to the second side of the pixel circuits of the first to third pixels; and
an auxiliary gate line branching from the horizontal gate line, disposed at the second metal layer, extending in the first direction, and supplying a gate signal to the pixel circuits of the first to third pixels.

10. The display device of claim 9, further comprising:
a display driver disposed on a side of the substrate and supplying a data voltage to the data line,
wherein the display driver supplies the gate signal to the auxiliary gate line via the vertical gate line and the horizontal gate line.

11. The display device of claim 9, further comprising:
a sensing line disposed at the first metal layer and extending in the first direction between the auxiliary gate line and the data line.

12. The display device of claim 11, wherein the data line includes:
a first data line disposed on a first side of the sensing line and supplying a first data voltage to the pixel circuit of the first pixel;
a second data line disposed on a first side of the first data line and supplying a second data voltage to the pixel circuit of the second pixel; and
a third data line disposed on a first side of the second data line and supplying a third data voltage to the pixel circuit of the third pixel.

13. The display device of claim 9, wherein the data line is electrically connected to at least one of the pixel circuits of the first to third pixels through a connection electrode disposed at a third metal layer on the second metal layer.

14. A display device comprising:
a first pixel, a second pixel, and a third pixel, each disposed on a substrate and including a pixel circuit;
a sensing line extending in a first direction on a first side of the pixel circuits of the first to third pixels and supplying an initialization voltage to the pixel circuits of the first to third pixels;
a data line extending in the first direction on a first side of the sensing line and supplying a data voltage to at least one of the pixel circuits of the first to third pixels;
a first voltage line extending in the first direction on a second side of the pixel circuits of the first to third pixels opposite to the first side of the pixel circuits of the first to third pixels and supplying a driving voltage to the pixel circuits of the first to third pixels;
a vertical gate line extending in the first direction on a second side of the first voltage line;
a horizontal gate line extending in a second direction intersecting the first direction on a third side of one of the pixel circuits of the first to third pixels adjacent to the second side of the pixel circuits of the first to third pixels and receiving a gate signal from the vertical gate line; and
an auxiliary gate line extending from the horizontal gate line in the first direction and supplying the gate signal received from the horizontal gate line to the pixel circuits of the first to third pixels.

15. The display device of claim 14, wherein the data line includes:
a first data line disposed on the first side of the sensing line and supplying a first data voltage to the pixel circuit of the first pixel;
a second data line disposed on a first side of the first data line and supplying a second data voltage to the pixel circuit of the second pixel; and
a third data line disposed on a first side of the second data line and supplying a third data voltage to the pixel circuit of the third pixel.

16. The display device of claim 15, wherein
the sensing line is disposed at a first metal layer on the substrate, and
the first data line is disposed at a second metal layer on the first metal layer.

17. The display device of claim 16, wherein
the sensing line is electrically connected to the pixel circuits of the first to third pixels through a first connection electrode disposed at a third metal layer on the second metal layer, and
the first data line is directly connected to the pixel circuit of the first pixel.

18. The display device of claim 17, wherein
the second data line is disposed at the first metal layer and is electrically connected to the pixel circuit of the second pixel through a second connection electrode disposed at the third metal layer, and
the third data line is disposed at the second metal layer and is directly connected to the pixel circuit of the third pixel.

19. The display device of claim 14, wherein
the vertical gate line is disposed at a first metal layer on the substrate, and
the horizontal gate line and the auxiliary gate line are disposed at a second metal layer on the first metal layer.

20. The display device of claim 19, further comprising:
a display driver disposed on a side of the substrate and supplying the data voltage to the data line,
wherein the display driver supplies the gate signal to the auxiliary gate line via the vertical gate line and the horizontal gate line.

* * * * *